(12) United States Patent
Yang

(10) Patent No.: US 9,806,675 B2
(45) Date of Patent: Oct. 31, 2017

(54) POWER AMPLIFICATION DEVICE AND METHOD

(71) Applicant: Samsung Electronics Co., Ltd., Gyeonggi-do (KR)

(72) Inventor: Dong-Il Yang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/030,941

(22) PCT Filed: Sep. 29, 2014

(86) PCT No.: PCT/KR2014/009094
§ 371 (c)(1),
(2) Date: Apr. 21, 2016

(87) PCT Pub. No.: WO2015/060556
PCT Pub. Date: Apr. 30, 2015

(65) Prior Publication Data
US 2016/0248381 A1    Aug. 25, 2016

(30) Foreign Application Priority Data

Oct. 23, 2013   (KR) .................. 10-2013-0126658

(51) Int. Cl.
*H03F 1/02*   (2006.01)
*H03F 3/24*   (2006.01)
(Continued)

(52) U.S. Cl.
CPC ......... *H03F 1/0216* (2013.01); *H03F 1/0227* (2013.01); *H03F 3/193* (2013.01);
(Continued)

(58) Field of Classification Search
USPC .............. 330/296–297, 127, 129, 134, 279
See application file for complete search history.

(56) References Cited

U.S. PATENT DOCUMENTS 8,981,851 B2 *  3/2015  Hori ................... H03F 3/189
                                                        330/136
2005/0046474 A1  3/2005  Matsumoto et al.
(Continued)

FOREIGN PATENT DOCUMENTS

| JP | 2005-102146 A | 4/2005 |
| JP | 2009-189215 A | 8/2009 |
| KR | 10-2006-0038134 A | 5/2006 |

OTHER PUBLICATIONS

Choi et al.; "A 45/46/34% PAE Linear Polar Transmitter for EDGE/WCDMA/Mobile-WiMax"; Microwave Symposium Digest; 2009; pp. 413-416.

(Continued)

*Primary Examiner* — Hieu Nguyen
(74) *Attorney, Agent, or Firm* — Cha & Reiter, LLC

(57) ABSTRACT

Various embodiments of the present invention relate to a power amplification device and method, wherein the power amplification device can comprise: a power amplifier; a switch mode converter for controlling a bias of the power amplifier; a comparator for providing a switching signal to the switch mode converter according to an envelope signal; and a control unit for determining whether a switching frequency of the switch mode converter is within a specific band and applying an offset to the switching frequency so as to deviate from the specific band if the switching frequency of the switch mode converter is within the specific band. Various other embodiments can be carried out.

15 Claims, 24 Drawing Sheets

(51) Int. Cl.
  *H03F 3/193* (2006.01)
  *H03F 3/195* (2006.01)
  *H03F 3/45* (2006.01)
  *H03K 3/037* (2006.01)
  *H02M 3/156* (2006.01)
  *H02M 1/44* (2007.01)

(52) U.S. Cl.
  CPC ............ *H03F 3/195* (2013.01); *H03F 3/245* (2013.01); *H03F 3/45475* (2013.01); *H02M 1/44* (2013.01); *H02M 3/156* (2013.01); *H03F 2200/102* (2013.01); *H03F 2200/351* (2013.01); *H03F 2200/451* (2013.01); *H03F 2200/555* (2013.01); *H03F 2200/78* (2013.01); *H03F 2203/45522* (2013.01); *H03F 2203/45528* (2013.01); *H03F 2203/45591* (2013.01); *H03F 2203/45594* (2013.01); *H03K 3/0377* (2013.01)

(56) References Cited

U.S. PATENT DOCUMENTS

| 2006/0094376 | A1 | 5/2006 | Lee et al. |
| 2007/0049202 | A1 | 3/2007 | Kokuzawa |
| 2009/0289720 | A1 | 11/2009 | Takinami et al. |
| 2011/0031953 | A1 | 2/2011 | Kanbe et al. |
| 2012/0242413 | A1 | 9/2012 | Lesso |
| 2013/0207731 | A1 | 8/2013 | Balteanu |
| 2013/0217345 | A1 | 8/2013 | Balteanu et al. |

OTHER PUBLICATIONS

Choi, et al.; "A Polar Transmitter With CMOS Programmable Hysteretic-Controlled Hybrid Switching Supply Modulator or Multistandard Applications"; IEEE Transactions on Microwave Theory and Techniques, vol. 57, No. 7, Jul. 2009.
European Search Report, dated Mar. 21, 2017.

\* cited by examiner

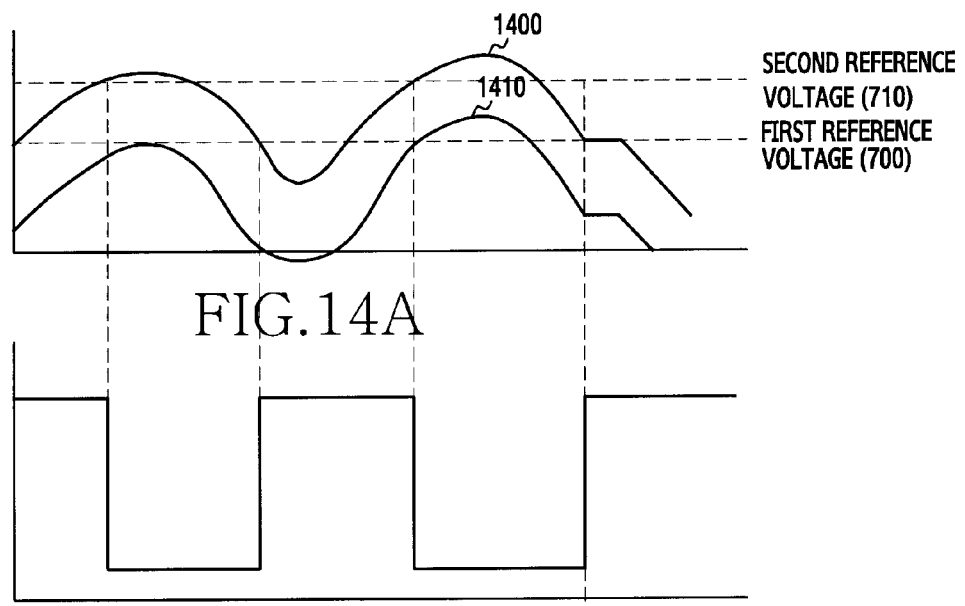
FIG.14A
FIG.14B
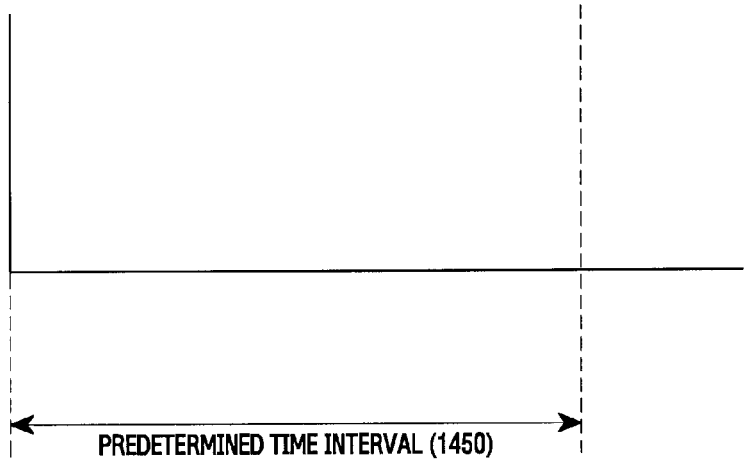
PREDETERMINED TIME INTERVAL (1450)
FIG.14C

PREDETERMINED TIME INTERVAL (1550)

| BAND | CHANNEL | REFERENCE VOLTAGE OR VARIABLE RESISTANCE CHANGE VALUE |
|---|---|---|
| 7 | 1 | X |
| 4 | 2 | Y |
| ⋮ | | |

FIG.22

POWER AMPLIFICATION DEVICE AND METHOD

CLAIM OF PRIORITY

This application is a National Phase Entry of PCT International Application No. PCT/KR2014/009094, which was filed on Sep. 29, 2014, and claims a priority to Korean Patent Application No. 10-2013-0126658, which was filed on Oct. 23, 2013, the contents of which are incorporated herein by reference.

TECHNICAL FIELD

The present disclosure relates to an apparatus and method for power amplification for reducing interference which affects a receiver by a transmitter power amplifier in a communication apparatus.

BACKGROUND ART

A wireless communication system has usually used a digital modulation scheme in order to efficiently use limited frequency resources. A digital modulated signal may be transferred to an antenna through an amplification process of a signal using a Radio Frequency (RF) power amplifier according to the purpose.

Meanwhile, a multi-carrier transmission scheme and a multidimensional modulation scheme which can transmit a lot of information according to user requirements for high-speed and high-capacity data processing have been developed. When the multi-carrier transmission scheme and the multidimensional modulation scheme are transmitted through a High Power Amplifier (HPA), signal distortion may be caused by nonlinear characteristics which the HPA has.

The wireless communication system may improve a transmission and reception performance by allowing a power amplifier of a transmitter to have high-linearity/high-efficiency characteristics in various situations other than the case as described above.

DETAILED DESCRIPTION OF THE INVENTION

Technical Problem

In the prior art, when a switching frequency of a DC-DC converter of an ET power amplifier or harmonics of the switching frequency are included in a reception band, reception conduction and a switching noise flows to a reception path by switching harmonics, thereby radiatively generating performance degradation.

Various embodiments of the present disclosure may provide a power amplification apparatus and method for applying an offset to the switching frequency to allow the switching harmonic frequency to escape from the reception band range when a DC-DC harmonic frequency is included in a reception band range due to the switching operation of a power modulator for controlling the bias voltage of the power amplifier.

Various embodiments of the present disclosure may provide a power amplification apparatus and method for improving a reception conduction performance by applying an offset to the switching frequency to allow the switching frequency and the harmonics of the switching frequency not to be included in the reception band.

TECHNICAL SOLUTION

According to various embodiments of the present disclosure, a power amplification apparatus may include: a power amplifier; a switch mode converter that controls a bias voltage of the power amplifier; a comparator that provides a switching signal to the switch mode converter according to an envelope signal; and a controller that determines whether a switching frequency of the switch mode converter is included in a specific band, and applies an offset to the switching frequency to escape from the specific band when the switching frequency of the switch mode converter is included in the specific band.

According to various embodiments of the present disclosure, the controller changes the switching frequency of the switch mode converter by changing an input signal or a reference voltage of the comparator.

According to various embodiments of the present disclosure, the power amplification apparatus may further include a variable resistance unit that is connected to an input of the comparator and distributes an input voltage.

According to various embodiments of the present disclosure, the comparator is configured by a Schmidt trigger circuit and the reference voltage of the comparator includes one of a first reference voltage changing from high to low and a second reference voltage changing from low to high.

According to various embodiments of the present disclosure, the reference voltage of the comparator may be controlled as a value of an element controlling the first reference voltage and the second reference voltage in the Schmidt trigger circuit is changed.

According to various embodiments of the present disclosure, the switching signal corresponds to a signal according to turning on/off, and frequency characteristics of the switching signal may be controlled by changing an on/off time of a DC-DC output.

According to various embodiments of the present disclosure, the controller detects a current switching frequency in order to determine whether harmonic frequency components of the DC-DC output are induced to the reception band of a communication band due to the switching operation of a power modulator for controlling a bias voltage of the power amplifier. When a multiplied frequency of the switching frequency is in a state of degrading the conduction of the reception band, the switching frequency may be offset to escape from the specific band.

According to various embodiments of the present disclosure, the power amplification apparatus may further include a linear amplifier that compensates for an error when a voltage difference between the envelope signal and an output signal of the switch mode converter is applied as the error.

According to various embodiments of the present disclosure, a power amplification method may include: determining whether a switching frequency of a switch mode converter is included in a specific band; and applying an offset to the switching frequency to allow the switching frequency to escape from the specific band when the switching frequency of the switch mode converter is included in the specific band.

According to various embodiments of the present disclosure, the switching frequency of the switch mode converter is changed based on an input signal or a reference voltage of a comparator supplying a switching signal to the switch mode converter.

According to various embodiments of the present disclosure, the input signal of the comparator may be distributed by a variable resistance of an input terminal.

According to various embodiments of the present disclosure, the comparator is configured by a Schmidt trigger circuit and the reference voltage of the comparator includes one of a first reference voltage changing from high to low and a second reference voltage changing from low to high.

According to various embodiments of the present disclosure, the reference voltage of the comparator may be controlled as a value of an element controlling the first reference voltage and the second reference voltage in the Schmidt trigger circuit is changed.

According to various embodiments of the present disclosure, the switching signal corresponds to a signal according to DC-DC turning on/off, and frequency characteristics of the switching signal may be controlled by changing an on/off time of a DC-DC output.

According to various embodiments of the present disclosure, the method further includes: detecting a current switching frequency in order to determine whether harmonic frequency components of the DC-DC output is induced to the reception band of the communication band due to the switching operation of a power modulator for controlling a bias voltage of the power amplifier; and the switching frequency may be offset to escape from the specific band when a multiplied frequency of the switching frequency is in a state of degrading the conduction of the reception band.

According to various embodiments of the present disclosure, an electronic device may include: a power amplifier; a switch mode converter configured to control a bias voltage of the power amplifier; a comparator configured to provide a switching signal to the switch mode converter based on an envelope signal; and a controller that determines whether a multiplied frequency of a switching frequency of the switch mode converter is included in a reception band, and applies an offset to the switching frequency to escape from the reception band when the switching frequency of the switch mode converter is included in the reception band.

According to various embodiments of the present disclosure, the controller changes the switching frequency of the switch mode converter by changing an input signal or a reference voltage of the comparator.

According to various embodiments of the present disclosure, the electronic device may further include a variable resistance unit that is connected to an input of the comparator and distributes an input voltage.

According to various embodiments of the present disclosure, the comparator is configured by a Schmidt trigger circuit and the reference voltage of the comparator includes one of a first reference voltage changing from high to low and a second reference voltage changing from low to high.

According to various embodiments of the present disclosure, the reference voltage of the comparator may be controlled as a value of an element controlling the first reference voltage and the second reference voltage in the Schmidt trigger circuit is changed.

According to various embodiments of the present disclosure, the switching signal is a pulse signal having a frequency spectrum similar to an envelope signal, and the switching frequency is changed by changing a number of times of turning on/off during a predetermined time.

According to various embodiments of the present disclosure, the controller determines whether a multiplied frequency of a switching frequency of the switch mode converter is included in the reception band when a bias voltage corresponding to the envelope signal is provided to the power amplifier by the switch mode converter, and applies the offsets to the switching frequency to escape from the reception band when the multiplied frequency of the switching frequency of the switch mode converter is included in the reception band.

According to various embodiments of the present disclosure, the controller determines whether a baseband signal corresponds to a voice signal or whether a band of the baseband signal is smaller than a threshold value so as to determine whether the bias voltage corresponding to the envelope signal may be provided to the power amplifier by only the switch mode converter.

According to various embodiments of the present disclosure, the electronic device may further include a linear amplifier that compensates for an error when a voltage difference between the envelope signal and an output signal of the switch mode converter is applied as the error.

Effects of the Invention

As described above, a switching frequency is offset such that harmonics of the switching frequency or a switching frequency are not included in a reception band, thereby improving a reception conduction performance.

Further, even when a radiation noise is induced to a reception path through an antenna because the antenna is adjacent to a power amplifier or radiation shielding is incompleteness, conduction degradation can be prevented.

BRIEF DESCRIPTION OF THE DRAWINGS

FIG. 14 illustrates an example in which the pulse width control signal is generated when the input voltage of the hysteresis comparator decreases according to various embodiments of the present disclosure.

FIG. 22 illustrates a lookup table according to various embodiments of the present disclosure.

MODE FOR CARRYING OUT THE INVENTION

Figure 1:
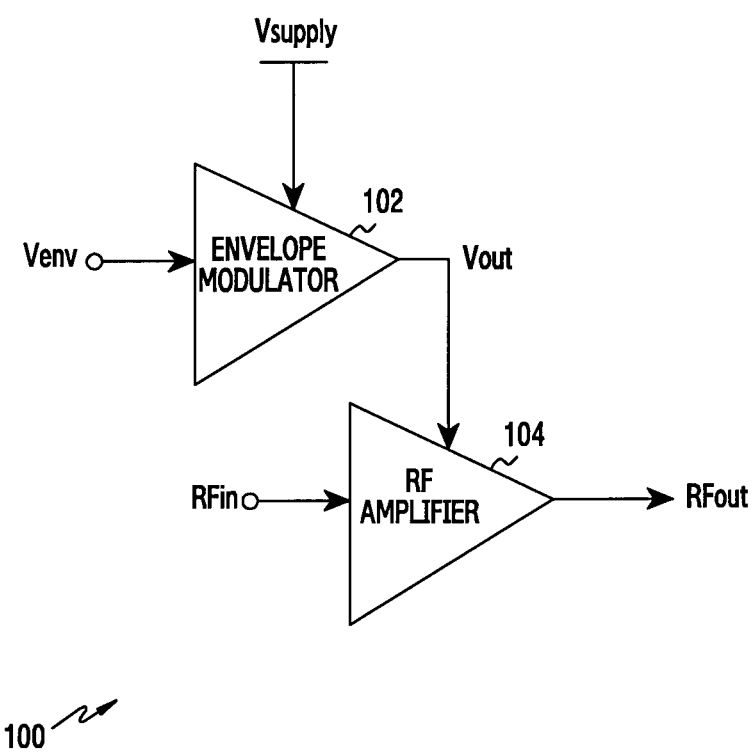
FIG. 1 briefly illustrates an Envelope Tracking (ET) power amplifier according to various embodiment of the present disclosure.

Hereinafter, exemplary embodiments of the present disclosure will be described in detail with reference to the accompanying drawings. Further, in the following description of various embodiments of the present disclosure, a detailed description of known functions or configurations incorporated herein will be omitted when it may make the subject matter of the present disclosure rather unclear. The terms as described below are defined in consideration of the functions in the embodiments, and the meaning of the terms may vary according to the intention of a user or operator, convention, or the like. Therefore, the definition should be made based on the overall contents of the present specification.

A power amplification device according to various embodiments of the present disclosure may be a device included in an electronic device. For example, the electronic device may be one or a combination of a smart phone, a tablet Personal Computer (PC), a mobile phone, a video phone, an e-book reader, a desktop PC, a laptop PC, a netbook computer, a Personal Digital Assistant (PDA), a Portable Multimedia Player (PMP), an MP3 player, a mobile medical device, an electronic bracelet, an electronic appcessary, a camera, a wearable device, an electronic clock, a wrist watch, a home appliance (for example, refrigerator, air conditioner, cleaner, oven, microwave oven, washing machine, and air cleaner), an artificial intelligence robot, a TeleVision (TV), a Digital Video Disk (DVD) player, an audio player, various types of medical devices (for example, Magnetic Resonance Angiography (MRA), Magnetic Resonance Imaging (MRI), Computed Tomography (CT), scanner, an ultrasonic device, and the like), a navigation device, a Global Positioning System (GPS) receiver, an Event Data Recorder (EDR), a Flight Data Recorder (FDR), a set-top box, a TV box (for example, Samsung HomeSync™, Apple TV™, or Google TV™), an electronic dictionary, a vehicle infotainment device, electronic equipment for a ship (for example, a navigation device for ship, a gyro compass, and the like), avionics, a security device, electronic clothes, an electronic key, a camcorder, game consoles, a Head-Mounted Display (HMD), a flat panel display device, an electronic frame, an electronic album, furniture or a part of buildings/structures having a communication function, an electronic board, an electronic signature receiving device, a wearable device, and a projector. It is obvious to those skilled in the art that the electronic device according to the present disclosure is not limited to the aforementioned devices.

Hereinafter, various embodiments of the present disclosure will describe an apparatus and method for power amplification, which allows a switching frequency of a switch mode converter, which controls a bias voltage of a voltage amplifier, to be offset so as to make the switching frequency be not included in a reception band.

An RF power amplifier may be used in various applications. The RF power amplifier may be operated to allow an RF input signal (RFin) having a small amount of energy to be converted into an RF output signal (RFout) having a large amount of amplified energy. Energy required to complete the conversion process may be generally provided by a Direct Current (DC) voltage supply (Vsupply), i.e, a battery power supply.

In order to supply a power to the RF power amplifier, the RF power amplifier may apply a "fixed drain bias" scheme in which a fixed DC voltage supply (Vsupply) is directly connected to a drain of a transistor (generally, Field Effect Transistor (FET) having a gate, a drain, and a source). Efficiency of a power amplifier operated by the fixed drain bias may be reduced because a width of an RF input signal (RFin) is lower than the fixed DC voltage supply (Vsupply).

An "Envelope Tracking (ET)" power amplifier for acquiring power efficiency higher than the fixed drain bias scheme is briefly illustrated in FIG. 1. The ET power amplifier 100 may be configured by an envelope modulator 102 and an RF power amplifier 104. The envelope modulator 102 may modulate the supply voltage (Vsupply) according to an envelope signal (Venv). Herein, the RF input signal (RFin) is provided to an input terminal of an RF power amplifier 104 and the envelope signal (Venv) may include envelope information of the RF input signal (RFin).

An envelope modulated power supply signal (VOUT) caused by the envelope modulator 102 may be connected to a supply voltage input of the RF power amplifier 104. That is, the envelope modulated power supply signal (VOUT) caused by the envelope modulator 102 may be used as a bias voltage or current of the RF power amplifier 104. In this event, the RF power amplifier 104 may amplify an RF input signal (RFin) according to the envelope modulated power supply signal (VOUT) and provide an RF output signal (RFout). Since the envelope modulated power supply signal (VOUT) tracks an envelope of the RF input signal (RFin), the RF power amplifier 104 may be operated with a power efficiency higher than the RF power amplifier using the fixed drain bias.

Figure 2:
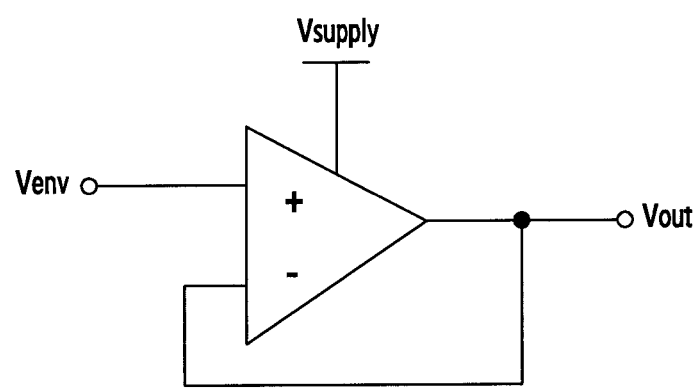
FIG. 2 briefly illustrates a linear amplifier of an ET power amplifier.

In an ET power amplifier 100 of FIG. 1, the envelope modulator 102 may be implemented by various methods. One method is to use a linear amplifier (regulator). The linear amplifier may generate an output signal by linearly processing an input signal. Therefore, an envelope signal (Venv) may be applied to an input of the linear amplifier as shown in FIG. 2. The linear amplifier may provide the envelope modulated power supply signal (VOUT) linearly tracking an amplitude change of the linear envelope signal (Venv).

The linear amplifier 200 may quickly react according to a rapid change of the envelope signal (Venv). Therefore, when the linear amplifier 200 is used in implementing the envelope modulator 102 in the ET power amplifier 100 of FIG. 1, the ET power amplifier 100 may provide an ability which can be operated in a wide band width. Since a current communication system such as an Orthogonal Frequency-Division Multiplexing (OFDM) based system and a Wideband Code Division Multiple Access (W-CDMA) cellular communication system uses a wideband signal, a wide band width operation is preferable.

Figure 3:
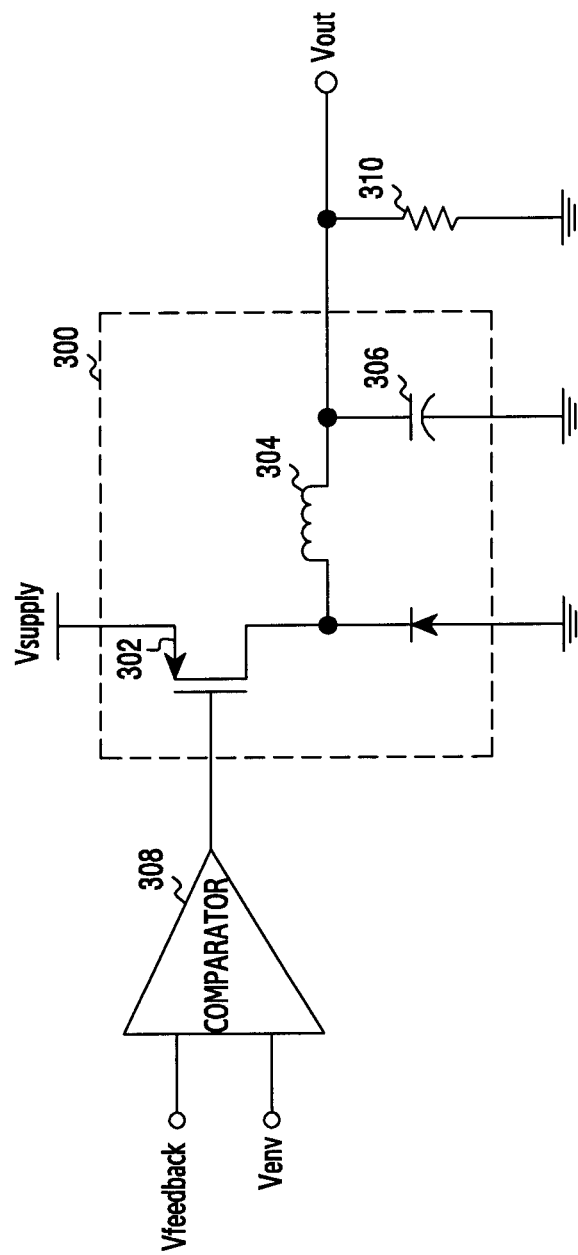
FIG. 3 illustrates a diagram of a buck converter according to various embodiments of the present disclosure.

A switch-mode converter may be used for implementing the envelope modulator 102 of the ET power amplifier 100 of FIG. 1 and corresponds to another conversion apparatus having efficiency higher than the linear amplifier 200. FIG. 3 is a diagram of a switch mode converter 300 (or a "step down" converter or a "buck" converter can be used) according to various embodiments of the present disclosure. The switch mode converter 300 may include a power supply (or "switching") transistor 302 which is configured to be operated as a switch, an inductor 304, and a capacitor 306. The switching transistor 302 may be controlled by a pulse width modulated switch control signal provided by a comparator 308 which is configured to be operated as a pulse width modulator. The pulse width modulated switch control signal is a square wave having a Duty cycle (D) according to a change of an amplitude of an envelope signal (Venv). The duty cycle refers to a ratio, is displayed as a percentage, of a high portion to a low portion during a period in the square wave. When the pulse width modulated switch control signal is applied to a gate of the switching transistor 302, the switching transistor 302 is turned on/off so that a connection and a disconnection between the DC supply voltage (Vsupply) and the inductor 304 may be alternately performed. The inductor 304 and the capacitor 306 may be operated as a low-pass filter for filtering an inductor current before being transmitted to a load resistance 310. The output voltage signal (VOUT) may be represented in proportion to a product of a size of the duty cycle (D) and a size of the DC supply voltage (Vsupply). That is, the output voltage signal (VOUT) corresponds to an envelope modulated power supply signal tracking an amplitude change of the envelope signal (Venv).

While the switch mode converter 300 of FIG. 3 effectively generates an envelope modulated power supply signal, a switching speed is slow and a switching noise may be generated. The switching noise corresponds to a noise by the switching operation of the switching transistor 302. Filtering may not completely remove the switching noise and the switching noise may be inevitably induced to the RF output signal (RFout) of the RF power amplifier. It may be difficult for the switching noise to satisfy signal-to-noise ratio requirements required in a wireless standard. The switch mode converter 300 may be slowed down by a large-sized gate capacitance represented by a large-sized switching transistor. In order to generate and supply a large current, a transistor having a large-sized gate area may be required. However, the large-sized gate area may cause a large parasitic capacitance (about 1000 pF) which restricts a switching speed of the switching transistor 412 by about 5 MHZ. In order to track an accurate envelope, a switching frequency of 20 times to 50 times, which is larger than a required envelope band width, is required and many kinds of signal have 1 MHz or more signal envelope band widths.

Figure 4:
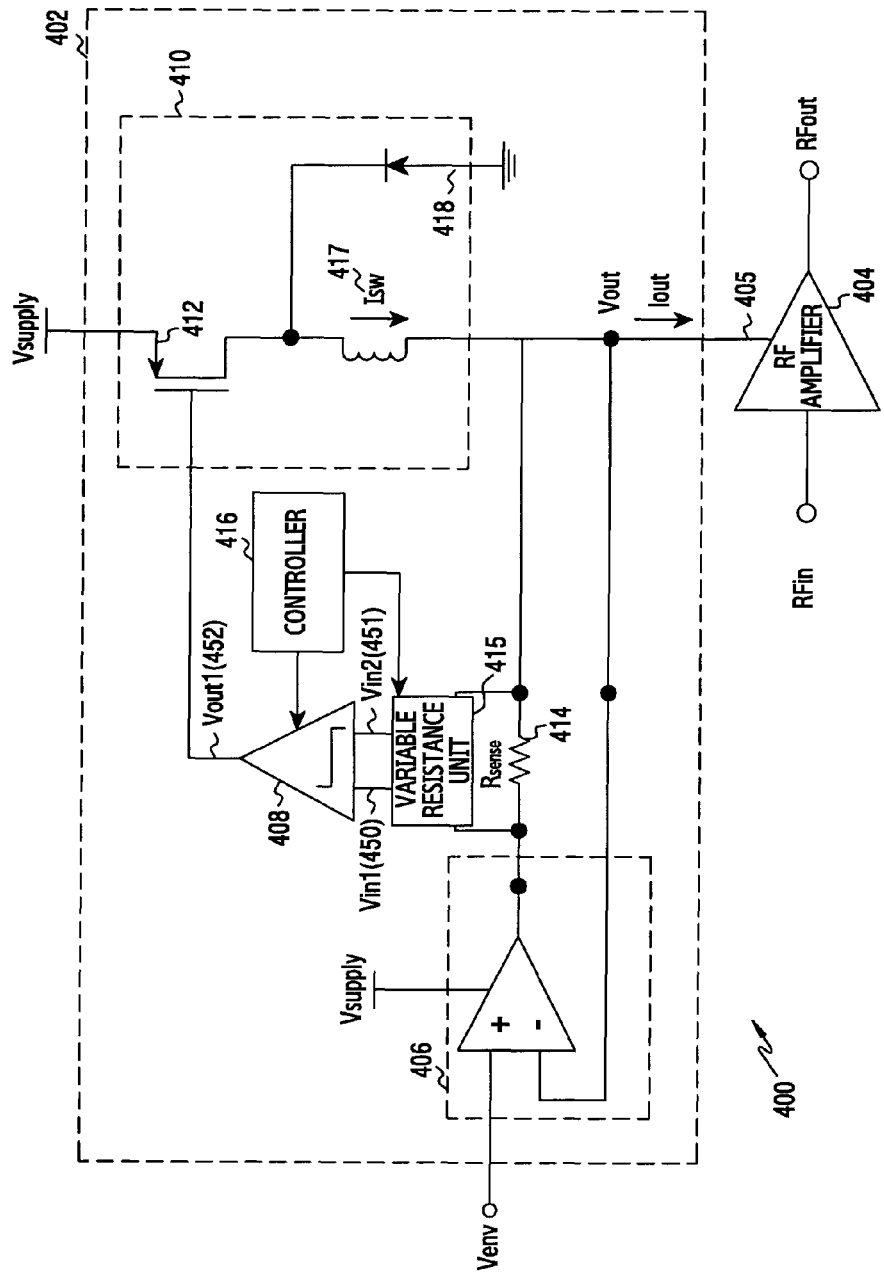
FIG. 4 illustrates a diagram of the ET power amplifier according to various embodiments of the present disclosure.

In order to satisfy the ET power amplifier satisfying both things in an effective and wide band width, it may be considered that a high-efficiency performance of the switch mode converter and a high bandwidth and a low noise performance of the linear amplifier are combined. FIG. 4 illustrates an embodiment of an ET power amplifier 400. The ET power amplifier 400 may be configured by an envelope modulator 402 and an RF power amplifier 404. The envelope modulator 402 may be configured by a linear amplifier 406, a hysteresis comparator 408, and a switch mode converter 410. The hysteresis comparator 408 may provide a pulse width modulated switch control signal to a switching transistor 412 of the switch mode converter 410 on the basis of a direction of a current flow detected by a current sense resistance 414. The direction of the current may be determined by whether the linear amplifier 406 supplies (sources) a current to the RF power amplifier 404 or reduces (sinks) a supply over-current from the switch mode converter 410. When the switch mode converter 410 provides excessive currents to a bias input terminal 405 of the RF power amplifier 404, excess currents which are not required by the RF power amplifier 404 may be reduced (sunk) by the linear amplifier 406. At a time point in which an instantaneous current required by the RF power amplifier 404 is larger than an instantaneous switch current supplied by the switch mode converter 410, the remaining current required by the RF power amplifier 404 may be supplied to the RF power amplifier 404 by the linear amplifier 406.

With reference to a configuration of the switch mode converter 410 according to an embodiment of the present disclosure, the switch mode converter 410 may include a Metal Oxide Silicon Field Effect Transistor (MOSFET) 412 of p type having a gate, a source, and a drain, an inductor 417, and a diode 418. In the gate of the P-MOSFET 412, may receive a pulse width switch control signal from the hysteresis comparator 408, the source may be connected to the system supply voltage (Vsupply), and the drain may be connected to a first input terminal of the inductor 417 and a cathode of the diode 418. A second terminal of the inductor 417 may be connected to a supply voltage input of the RF power amplifier 404.

In addition, the current sense resistance 414, which has a resistance value much lower than a load resistance value, of the RF power amplifier 404 may be configured in a current supply path of the linear amplifier 406. Terminals of the current sense resistance 414 are connected to an input of the hysteresis comparator 408 so as to control a value of a pulse width switch control signal applied to the P-MOSFET 412 of the switch mode converter 410.

For example, when an instant current supplied to the RF power amplifier 404 by the envelope modulator 402 is larger than a current required by the RF power amplifier 404, the current may be absorbed in the linear amplifier 406. When the instant current supplied to the RF power amplifier 404 by the envelope modulator 402 is smaller than the current required by the RF power amplifier 404, the linear amplifier 406 may compensate for an insufficient current.

In this event, the current sense resistance 414 detects a direction of a sense current flow and the hysteresis comparator 408 may respond by turning off the P-MOSFET 412 of the switch mode converter 410 when the instant current supplied to the RF power amplifier 404 by the envelope modulator 402 is larger than the current required by the RF power amplifier 404. When the inductor 417 is separated from the supply voltage (Vsupply), the inductor 417 discharges charged energy so as to supply a current to the RF power amplifier 404. When the current supplied to the RF power amplifier 404 is stabilized as a current required by the RF power amplifier 404, the current direction is reversed through the current sense resistance 414 and the switch mode converter 410 may again supply most currents to the RF power amplifier 404.

Further, when the instant current provided to the RF power amplifier 404 is insufficient for power requirements of the RF power amplifier in the switch mode converter 410, the hysteresis comparator 408 may respond by changing the pulse width switch control signal in the P-MOSFET 412 so as to allow the P-MOSFET 412 to be turned on. Until a current demand of the RF power amplifier 404 is fulfilled, the current supplied by the switch mode converter 410 may be supplemented by the current supplied by the linear amplifier 406.

That is, the envelope signal is amplified through the linear amplifier 406 and switching of the P-MOSFET 412 of the switch mode converter 410 may be turned on/off according to an output current direction. Further, the switch mode converter 410 supplies a power to a load through the inductor 417 and, a load terminal voltage (Vout) is negative fed back so as to be fed back as a differential input of the linear amplifier 406. Herein, a difference between the original envelope signal and the load terminal voltage (Vout) acts as an error so that the error may be compensated for by the linear amplifier 406 according to an operation of the negative feedback.

The hysteresis comparator 408 provides a pulse width modulated control signal, which is a control signal for switching the switch mode converter 410, to the switch mode converter 410. Further, in this event, the hysteresis comparator 408 may generate a switching noise repeating high and low according to turning on/off of the switch mode converter 410.

When the switching noise is overlapped with a reception band as shown in FIG. 19 below, a noise affects reception conduction so that reception degradation may occur. Specifically, a radiated noise may be induced to an antenna.

In various embodiments of the present disclosure, the controller 416 may apply an offset to the switching frequency of the switch mode converter 410 such that the switching noise is not included in a reception band.

Figure 24:
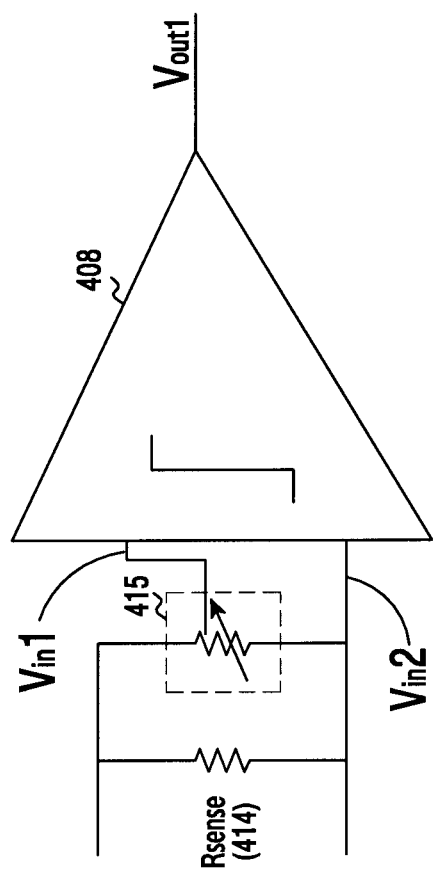
FIG. 24 illustrates a configuration for distributing an input voltage of the hysteresis comparator according to various embodiments of the present disclosure.

The switching frequency may be changed by adjusting a parameter of the hysteresis comparator 408 generating the switching signal. For example, the switching frequency is controlled by changing a first reference voltage 700 or a second reference voltage 710 of the hysteresis comparator 408 and controlling a pulse width and a duty cycle as shown in FIGS. 8 to 10, the switching frequency is controlled by changing the reference voltages and controlling the pulse width or the duty cycle during a predetermined time when one reference voltage is used as shown in FIGS. 11 and 12, and the pulse width or the duty cycle may be changed during a predetermined time by changing an input signal of the hysteresis comparator 408 as shown in FIGS. 13 to 16. For example, the input signal of the hysteresis comparator 408 may be changed using a variable resistance unit 415 connected to an input terminal. That is, as shown in FIG. 24, the variable resistance unit 415 is combined with the current sense resistance 414 and the input voltage is distributed, thereby being provided as an input of the hysteresis comparator 408.

Figure 5A:
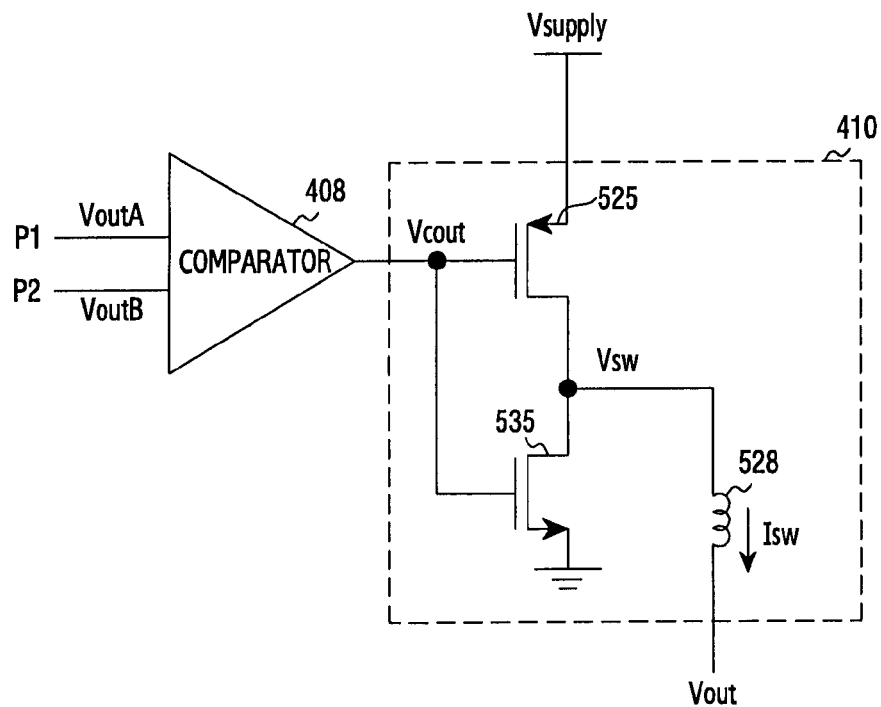
FIG. 5 illustrates a diagram of a buck converter of the ET power amplifier according to various embodiments of the present disclosure.

The switching mode converter 410 in FIG. 4 is configured by a P-MOSFET 412 having a gate, a source, and a drain, a diode, and inductor. However, in the configuration, an operation identical to operations of the P-MOSFET 412 and the diode can be implemented by a connection (couple) of another element. For example, in the switch mode converter 410 as shown in FIG. 5A, a diode can be replaced with an N-MOSFET 535, a gate of the N-MOSFET 535 is connected to an output terminal of the hysteresis comparator 408 as like the gate of the P-MOSFET 525, and the N-MOSFET 535 and the P-MOSFET 525 may be turned on/off according to the pulse width control signal of the hysteresis comparator 408. For example, the P-MOSFET 525 may be in an off state when the N-MOSFET 535 is in an on state, and the P-MOSFET 525 may be in the on state when the N-MOSFET 535 is in the off state.

Figure 5B:
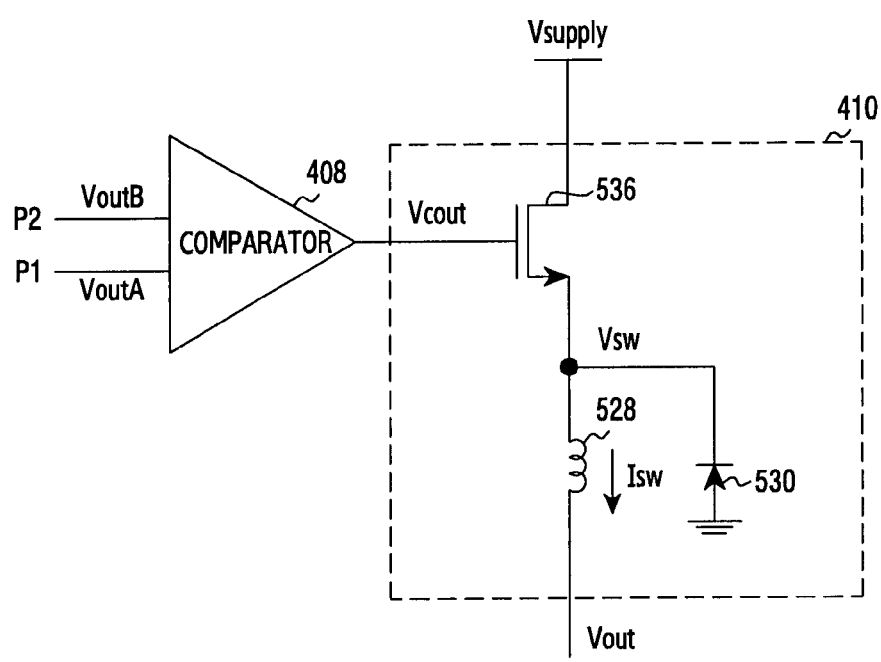

In addition, in the switch mode converter 410 as shown in FIG. 5B, a drain instead of the P-MOSFET 525 is accessed by the Vsupply and a source can be replaced with the N-MOSFET 536 accessed by the inductor 528. In this event, the input terminal of the hysteresis comparator 408 may be changed and configured. That is, the hysteresis comparator 408 may drive the N-MOSFET 536 with an output signal (nVcout) on the contrary to a case of driving the P-MOSFET 525.

According to an embodiment of the present disclosure, the hysteresis comparator 408 may be configured by a Schmidt trigger circuit as shown in FIG. 6 below.

Figure 6A:
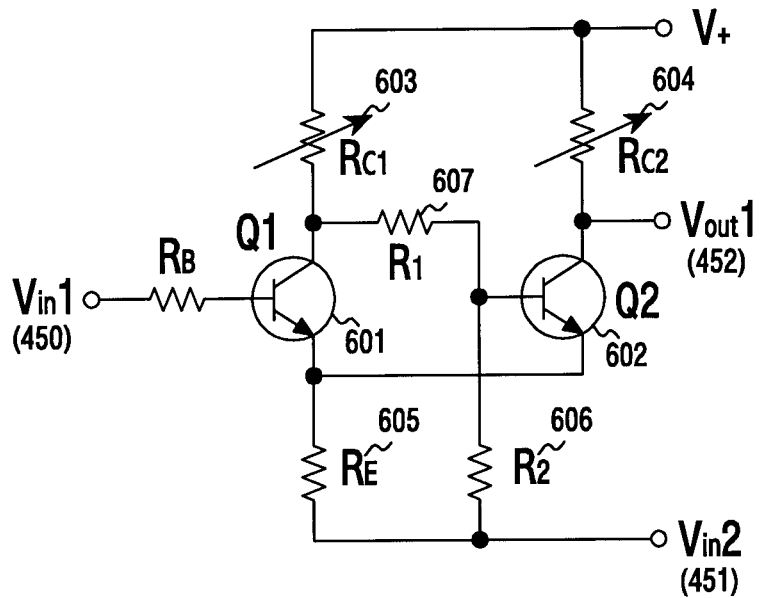
FIG. 6 illustrates a Schmidt trigger circuit of the ET power amplifier according to various embodiments of the present disclosure.
Figure 6B:
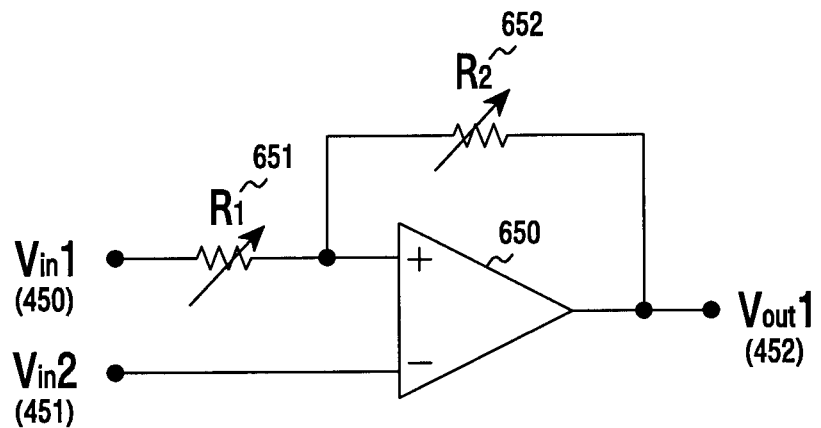

FIG. 6A illustrates a Schmidt trigger circuit including two N type Bipolar transistors (Q1 601 and Q2 602) and a plurality of resistances (RC1 603, RC2 604, R1 607, RE 605, and R2 606), and FIG. 6B illustrates a Schmidt trigger circuit including one comparator and two resistances.

In the case of FIG. 6A, in the two transistors 601 and 602, when one transistor is in a cut-off state, the other transistor is in a conducting state. Therefore, when there is no input voltage (e.g., Vin1 450), the Q1 601 is in the cut-off state, and a collector voltage of the Q1 601 is divided by two resistances Rc1 603 and R1 607 into divided voltages, which are then applied to a base of the Q2 602. As a result, the base of the Q2 602 may be in a saturation state and then be in a conducting state. When the input voltage (e.g., Vin1 450) increases, the Q1 601 is in the conducting state and the collector voltage gets lower so that the Q2 602 may be in the cut-off state.

For example, an operation in which, when one transistor of the two transistors 601 and 602 is in the cut-off state, the other transistor is in the conducting state is alternately performed so that the output voltage may be output as a waveform in which a pulse width is a rectangle.

In other words, the Schmitt trigger circuit may perform an operation in which an output waveform rises when an input voltage (e.g., Vin1 450) increases to be larger than or equal to a first predetermined value, and the output waveform descends when the input voltage decreases to be less than or equal to a second predetermined value. Therefore, the Schmitt trigger circuit may obtain a wave in which a pulse width corresponding to a conversion level is a rectangle when the input waveform enters. The Schmitt trigger circuit corresponds to a circuit sensitively operated according to the input voltage value and an output state may be converted by two different trigger voltage values (i.e., the first reference voltage 700 and the second reference voltage 710 of FIG. 7 below). The hysteresis voltage refers to a voltage in which a value is changed according to a previous voltage state change, not a voltage which is defined as a regular value in a constant state. When an output voltage with respect to the input voltage is determined, an output voltage value determined when an input voltage value increases is different from an output voltage value determined when the input voltage value lowers. The voltage characteristic as described above refers to having the hysteresis characteristic. The hysteresis characteristic may prevent the output voltage value from being shaken with respect to the input value near threshold value when the output voltage is determined as high or low with respect to any threshold value for the input voltage value. In this event, using the hysteresis characteristic, the output voltage may maintain high before the threshold value decreases to be less than or equal to a specific value, after becoming high at a predetermined value or higher. On the contrary, the output voltage may maintain low before the threshold value increases to be larger than or equal to a specific value, after becoming low at a predetermined value or less. That is, it may be prevented that the output voltage value is changed by a small change near the threshold value.

Two different trigger voltage values may be adjusted by a resistance RC1 603 or a resistance RC2 604. For example, the first trigger voltage may increase as the resistance RC1 603 decreases, the first trigger voltage may decrease as the resistance RC1 603 increases, the second trigger voltage may increase as the resistance RC2 604 decreases, and the second trigger voltage may decrease as the resistance RC2 604 increases.

In FIG. 6B, an output voltage Vout1 may be saturated regardless of a positive or negative direction by a positive feedback amount of a non-inverted input voltage (e.g., Vin1 450). When the output voltage Vout1 is saturated with a positive voltage, the positive (+) voltage may be fed back in the non-inverted input voltage (e.g., Vin1 450). The output voltage (Vout) 1 may maintain a state in which the voltage is saturated with a positive voltage while an inverted input voltage (e.g., Vin2 451) is less than a first threshold value. When an input voltage (e.g., Vin1 450) rises, the input voltage increases to be larger than the first threshold value. In this event, an error voltage may change polarity and then operate the comparator 650 in a negative saturation state. When the output voltage Vout1 becomes negative, the negative voltage may be fed back towards the non-inverted input (+) by feedback resistances R1 651 and R2 652. The negative voltage is referred to as a second threshold value. When the input voltage (e.g., Vin1 450) is larger than a second threshold value, the output voltage Vout1 maintains the negative saturation state. When the input voltage (e.g., Vin1 450) is lower than the second threshold value, the error voltage changes polarity and an amount of the output voltage Vout1 may be again changed to the positive saturation state.

Herein, the first trigger voltage and the second trigger voltage may be adjusted by adjusting the feedback resistance R1 651 or the resistance R2 652. For example, the first trigger voltage may increase as the resistance RC1 decreases, the first trigger voltage may decrease as the resistance RC1 increases, the second trigger voltage may increase as the resistance RC2 decreases, and the second trigger voltage may decrease as the resistance RC2 increases.

Figure 7:
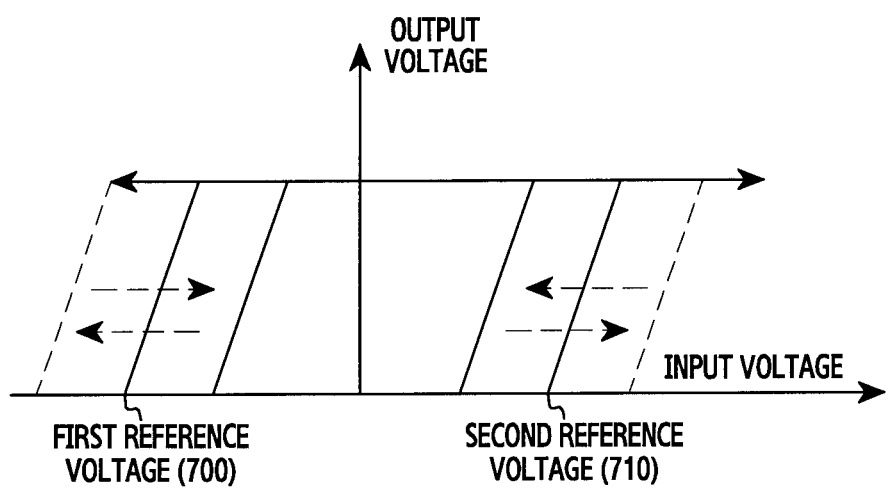
FIG. 7 is a graph illustrating a hysteresis characteristic of the Schmidt trigger circuit according to various embodiments of the present disclosure.

FIG. 7 is a graph illustrating a relationship between an input voltage and an output voltage indicating a hysteresis characteristic in the Schmidt trigger circuit.

Referring to FIG. 7, an output state maintains 0 or low until an input voltage increases to reach to a second reference voltage 710, and the output state is changed to 1 or high when the input voltage has reached the second reference voltage 710. In addition, the output state maintains 1 or high until the input voltage decreases to be less than or equal to the first reference voltage 700, and the output state may be changed to 0 or low when the input voltage has reached the first reference voltage 700.

A difference between the first reference voltage 700 and the second reference voltage 710 refers to hysteresis of a Schmitt trigger.

FIGS. 8 to 12 illustrate a change in the number of duty cycles of a pulse width when the first reference voltage 700 and the second reference voltage 710 are changed in the Schmitt trigger circuit.

According to various embodiments of the present disclosure, an output signal of the Schmitt trigger circuit may be used as a pulse width control signal of the switch mode converter 420 in FIG. 4. The pulse width control signal may be used as a control signal for turning on/off P type Metal Oxide Silicon Field Effect Transistors (MOSFET) 412, 525, and 536 of the switch mode converter 410.

FIG. 8 illustrates an example in which a duty cycle of a pulse width is changed when a first reference voltage is changed according to various embodiments of the present disclosure.

Referring to FIG. 8, a case, in which a pulse width is changed when a first reference voltage 700 decreases, is described.

Figure 8A:
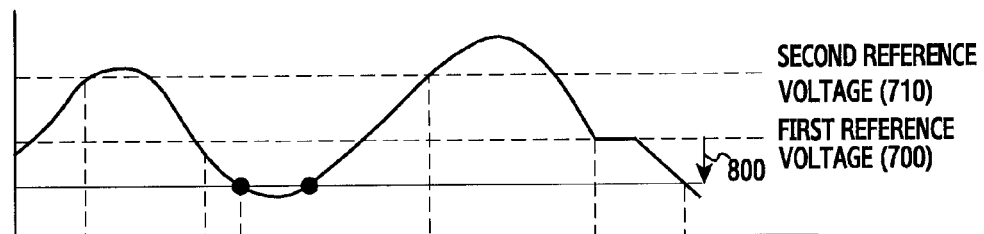
FIG. 8 illustrates an example in which a pulse width or a duty cycle is changed when a first reference voltage is changed according to various embodiments of the present disclosure.
Figure 8B:
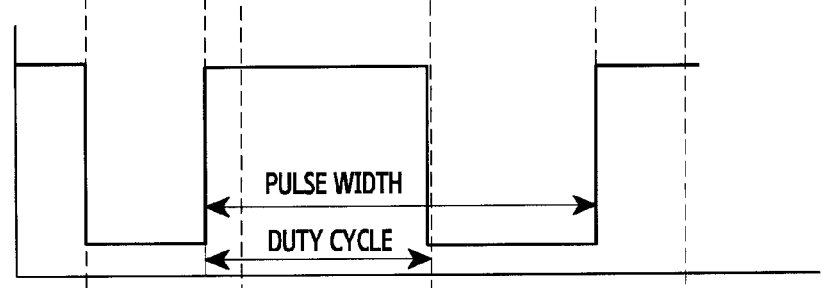
Figure 8C:
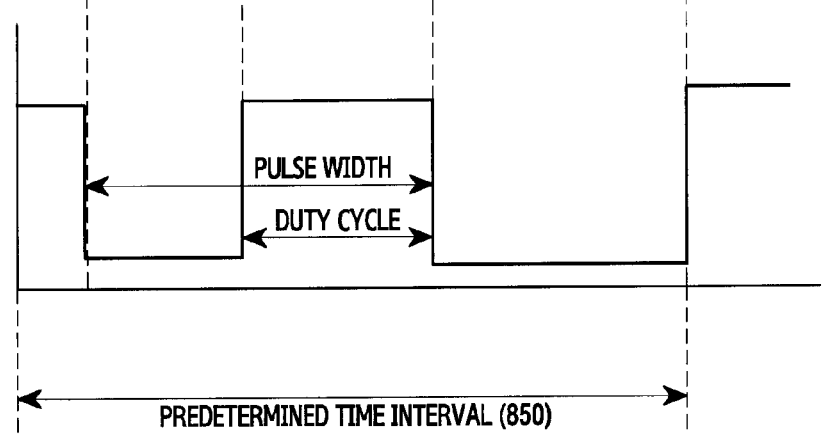

FIG. 8A illustrates that a first reference voltage 700 and a second reference voltage 710 of a Schmitt trigger circuit are compared, and FIG. 8B illustrates an output signal of the Schmitt trigger circuit before the first reference voltage 700 decreases and the second reference voltage 700 increases, and FIG. 8C illustrates an output signal of the Schmitt trigger circuit after the first reference voltage 700 decreases as indicated by reference numeral 800.

When comparing the output signals of FIGS. 8B and 8C, it may be considered that a pulse width or the number of duty cycles is changed during a predetermined time interval 850. Herein, the pulse width may refer to a period in which the transistor is turned on/off, and the duty cycle may refer to a section, in which the transistor is turned on for one period, of the pulse width. The number of times by which the transistor is tuned on/off during a predetermined period may be defined as a switching frequency of the switch mode converter 420. That is, the switching frequency may be defined as the number of times by which the P-MOSFETs 412, 525, and 536 of the switch mode converter 410 is turned on/off during the predetermined time interval 850.

Further, that a plurality of pulse widths or the number of duty cycles is changed during the predetermined interval 850 according to the change of the first reference voltage 700 may refer to that the switching frequency of the switch mode converter 420 is changed. For example, since 2.5 pulses, i.e., three on sections and two off sections exist during a predetermined time interval 850 in FIG. 8B, the switching frequency may be 2.5 (=5/2) Hz when the predetermined time interval 850 is one second. Further, since two pulses, i.e., two on section and two off sections exist during the predetermined time interval 850 in FIG. 8C, the switching frequency may be 2 Hz when the predetermined time interval 850 is one second.

FIG. 9 illustrates an example in which a duty cycle of a pulse width is changed when a second reference voltage is changed according to various embodiments of the present disclosure.

FIG. 9 illustrates a case in which a pulse width or the number of duty cycles is changed when the second reference voltage 710 increases.

Figure 9A:
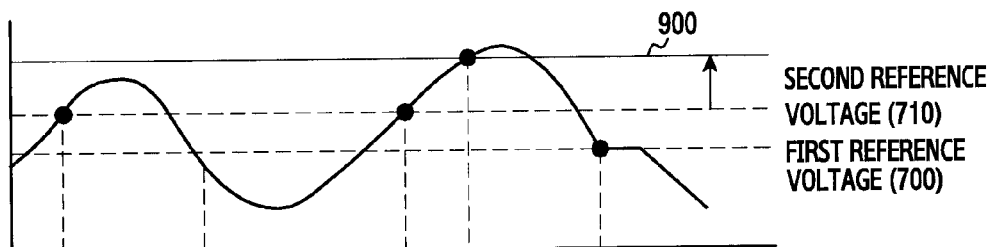
FIG. 9 illustrates an example in which a pulse width or a duty cycle is changed when a second reference voltage is changed according to various embodiments of the present disclosure.
Figure 9B:
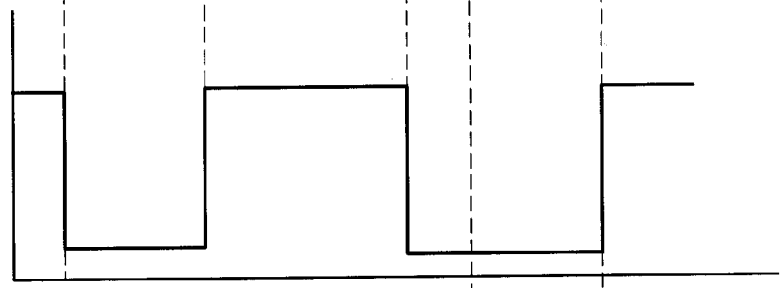
Figure 9C:
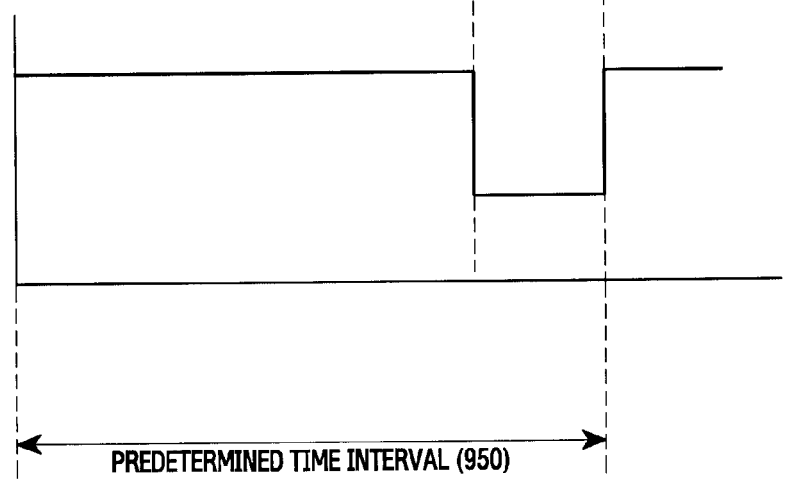

FIG. 9A illustrates that a first reference voltage 700 and a second reference voltage 710 of a Schmitt trigger circuit are compared, and FIG. 9B illustrates an output signal of the Schmitt trigger circuit before the first reference voltage 700 decreases and the second reference voltage 710 increases, and FIG. 9C illustrates an output signal of the Schmitt trigger circuit after the second reference voltage 710 increases as indicated by reference numeral 900.

When comparing the output signals of FIGS. 9B and 9C, it may be considered that a pulse width or the number of duty cycles is changed during a predetermined time interval 950. For example, since two pulses, i.e., two on sections and two off sections exist during a predetermined time interval 950 in FIG. 9B, the switching frequency may be 2 Hz when the predetermined time interval 950 is one second. Further, since one pulse, i.e., one on section and one off section exist during the predetermined time interval 950 in FIG. 9C, the switching frequency may be 1 Hz when the predetermined time interval 950 is one second.

FIG. 10 illustrates an example in which a pulse width or a duty cycle is changed when a first reference voltage and a second reference voltage are changed according to various embodiments of the present disclosure.

Referring to FIG. 10, a case, in which a pulse width is changed when both a first reference voltage 700 and a second reference voltage 710 have decreased, is described.

Figure 10A:
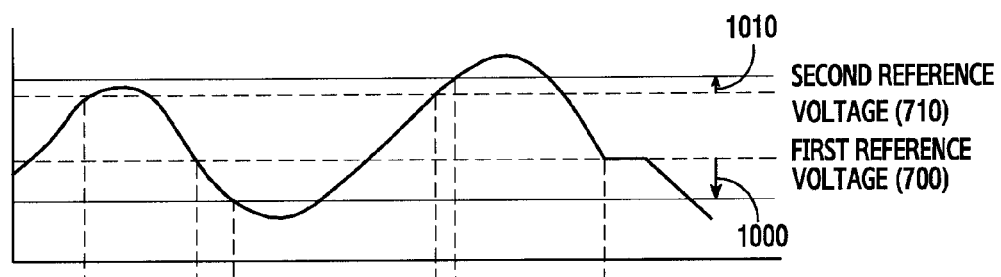
FIG. 10 illustrates an example in which a pulse width or a duty cycle is changed when the first reference voltage and the second reference voltage are changed according to various embodiments of the present disclosure.
Figure 10B:
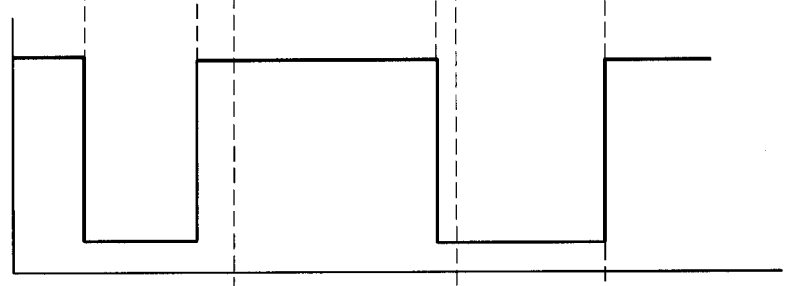

FIG. 10A illustrates that the first reference voltage 700 and the second reference voltage 710 of a Schmitt trigger circuit are compared, and FIG. 10B illustrates an output signal of the Schmitt trigger circuit before the first reference voltage 700 decreases and the second reference voltage 710 increases, and FIG. 9C illustrates an output signal of the Schmitt trigger circuit after the first reference voltage 700 decreases as indicated by reference numeral 1000 and the second reference voltage 710 increases as indicated by reference numeral 1010.

Figure 10C:
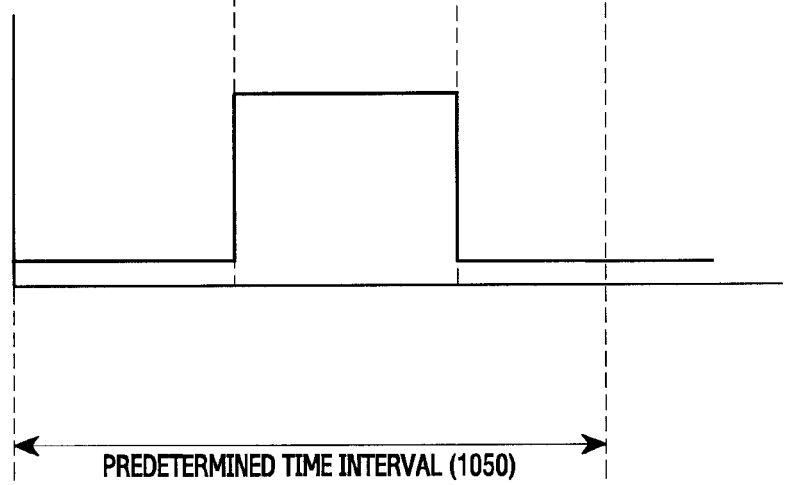

When comparing the output signals of FIGS. 10B and 10C, it may be considered that a pulse width or the number of duty cycles is changed during a predetermined time interval 1050. For example, since two pulses, i.e., two on sections and two off sections exist during a predetermined time interval 1050 in FIG. 10B, the switching frequency may be 2 Hz when the predetermined time interval 1050 is one second. Further, since 1.5 pulses, i.e., one on section and two off sections exist during the predetermined time interval 1050 in FIG. 10C, the switching frequency may be 1.5 Hz when the predetermined time interval 1050 is one second.

Although FIGS. 8 to 10 have used hysteresis characteristics using two reference voltages, a pulse width control signal may be generated using one reference voltage in various embodiments.

FIG. 11 illustrates an example in which a pulse width control signal is generated using one reference voltage according to various embodiments of the present disclosure.

Figures 11A, 11B:
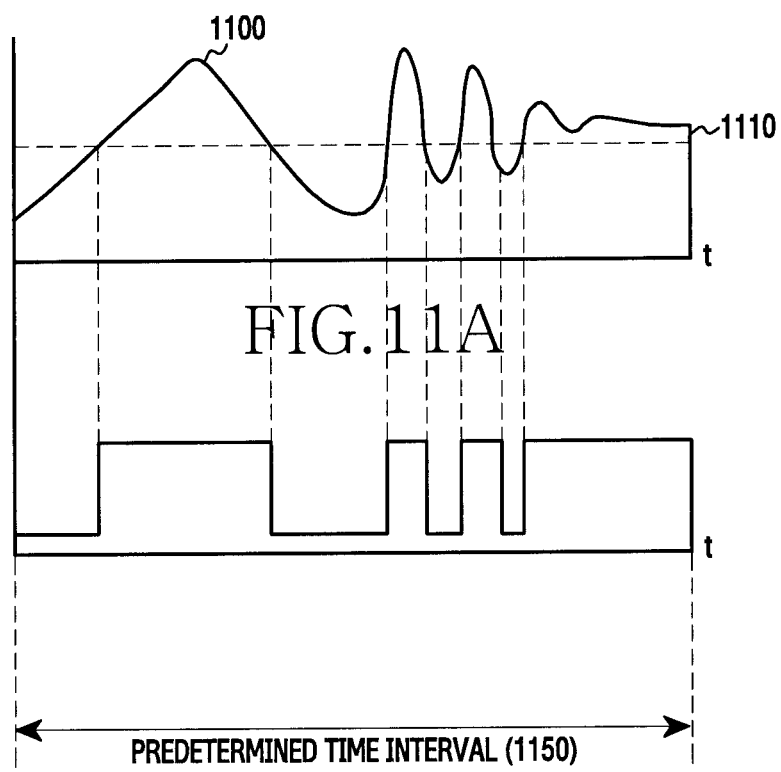
FIG. 11 illustrates an example in which a pulse width control signal is generated using one reference voltage according to various embodiments of the present disclosure.

FIG. 11A illustrates that the input voltage 1100 and one reference voltage 1110 are compared, and FIG. 11B illustrates a pulse width modulated signal which is in a high state when the input voltage 1100 is higher than the reference voltage 1110, and is in a low state when the input voltage 1100 is lower than the reference voltage 1110.

FIG. 12 illustrates an example in which a pulse width control signal is generated when a reference voltage is reduced according to various embodiments of the present disclosure.

Figures 12A, 12B:
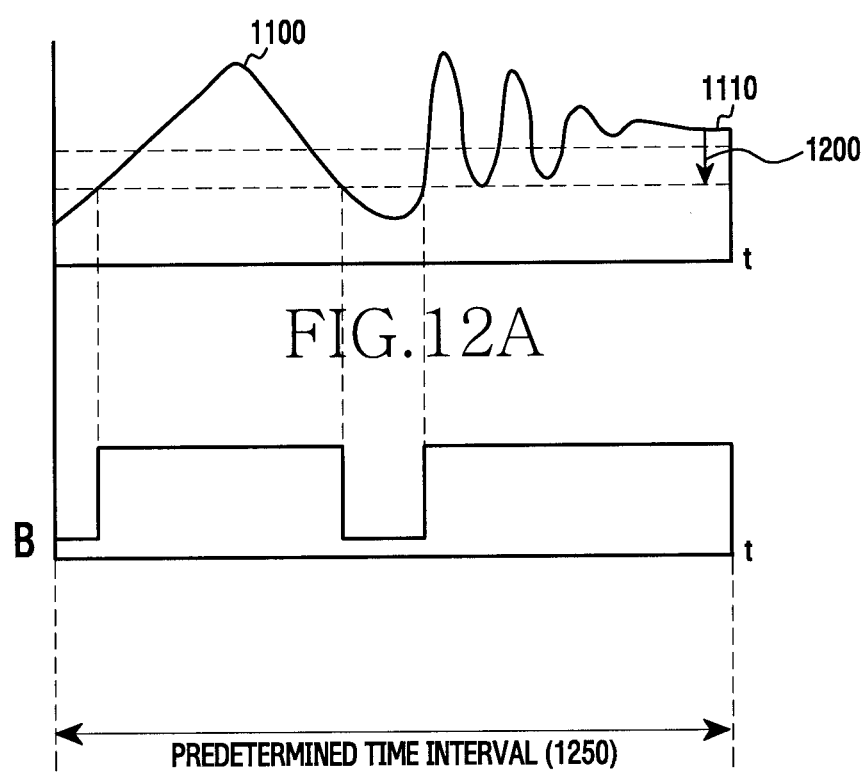
FIG. 12 illustrates an example in which the pulse width control signal is generated when a reference voltage is reduced according to various embodiments of the present disclosure.

FIG. 12A illustrates that an input voltage 1100 and one reference voltage 1110 are compared, as like FIG. 11A and the FIG. 12B illustrates an output signal when the reference voltage 1110 decreases as indicated by reference numeral 1200.

When comparing the output signals of FIGS. 11B and 12B, it may be considered that the number of duty cycles of a pulse width is changed during predetermined time intervals 1150 and 1250. For example, since four pulses, i.e., four on sections and four off sections exist during a predetermined time interval 1150 in FIG. 11B, the switching frequency may be 4 Hz when the predetermined time interval 1150 is one second. Further, since two pulses, i.e., two on sections and two off sections exist during the predetermined time interval 1250 in FIG. 12B, the switching frequency may be 2 Hz when the predetermined time interval 1250 is one second.

As shown in FIGS. 8 to 12, when at least one reference voltage is changed, a pulse width or the number of duty cycles during a predetermined time interval may be changed, and that the pulse width or the number of duty cycles during the predetermined time interval is changed may be considered as meaning that a switching frequency is changed.

In other various embodiments, the first reference voltage 700 and the second reference voltage 710 of the hysteresis comparator 408 are changed to control the pulse width or the duty cycle. Therefore, as shown in FIGS. 13 to 16, the pulse width or the duty cycle may be changed by changing an input signal of the hysteresis comparator 408 instead of the first reference voltage 700 and the second reference voltage 710 although the switching frequency for controlling an input voltage of the power amplifier may be changed. For example, the input signal of the hysteresis comparator 408 may be changed by a variable resistance unit 415 connected to an input terminal. That is, the variable resistance unit 415 may distribute a voltage across the current sense resistance 414 and then provide the voltage to an input of the hysteresis comparator 408.

FIG. 13 illustrates an example in which a pulse width control signal is generated by controlling an input voltage of the hysteresis comparator 408 according to various embodiments of the present disclosure.

Figure 13A:
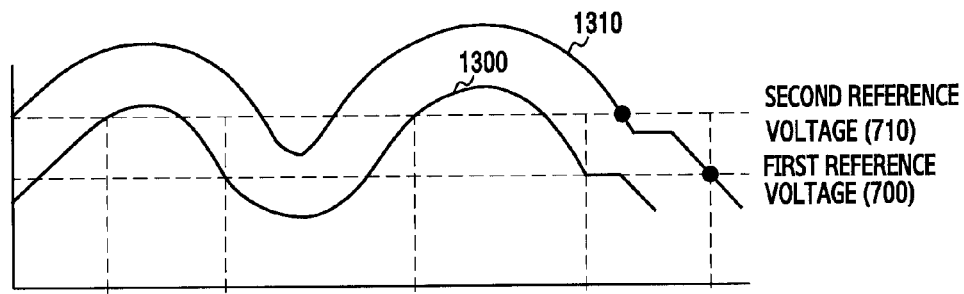
FIG. 13 illustrates an example in which the pulse width control signal is generated when an input voltage of a hysteresis comparator increases according to various embodiments of the present disclosure.

FIG. 13A illustrates that an input voltage 1300 and a changed input voltage 1310 of a Schmitt trigger circuit are compared. The input voltage of the Schmitt trigger circuit may be changed by a voltage distribution by the variable resistance unit 415 and the current sense resistance 414.

Figure 13B:
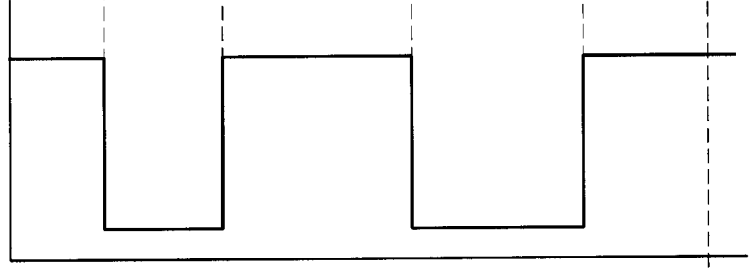
Figure 13C:
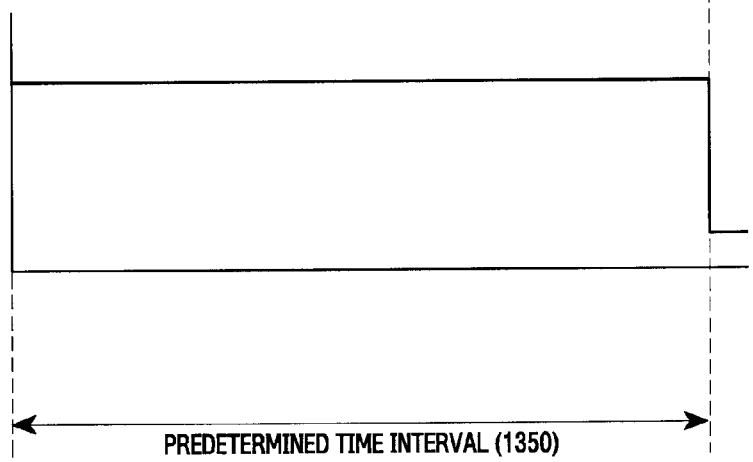

FIG. 13B illustrates an output signal according to the input voltage 1300 of the Schmitt trigger circuit, and FIG. 13C illustrates an output signal according to the changed input voltage 1310 of the Schmitt trigger circuit.

When comparing the output signals of FIGS. 13B and 13C, it may be considered that a pulse width or the number of duty cycles is changed during a predetermined time interval 1350. For example, since 2.5 pulses, i.e., three on sections and two off sections exist during a predetermined time interval 1350 in FIG. 13B, the switching frequency may be 2.5 Hz when the predetermined time interval 1350 is one second. Further, since 0.5 pulses, i.e., one on section exists during the predetermined time interval 1350 in FIG.

13C, the switching frequency may be 0.5 Hz when the predetermined time interval 1350 is one second.

FIG. 14 illustrates an example in which a pulse width control signal is generated by controlling an input voltage of the hysteresis comparator 408 according to various embodiments of the present disclosure.

FIG. 14A illustrates that an input voltage 1400 and a changed input voltage 1410 of a Schmitt trigger circuit are compared. The input voltage of the Schmitt trigger circuit may be changed by a voltage distribution by the variable resistance unit 415 and the current sense resistance 414.

FIG. 14B illustrates an output signal according to the input voltage 1400 of the Schmitt trigger circuit, and FIG. 14C illustrates an output signal according to the changed input voltage 1410 of the Schmitt trigger circuit.

When comparing the output signals of FIGS. 14B and 14C, it may be considered that a pulse width or the number of duty cycles is changed during a predetermined time interval 1450. For example, since two pulses, i.e., two on sections and two off sections exist during a predetermined time interval 1450 in FIG. 14B, the switching frequency may be 2 Hz when the predetermined time interval 1450 is one second. Further, since off sections exist during the predetermined time interval 1450 in FIG. 14C, the switching frequency may be 0.5 Hz when the predetermined time interval 1450 is one second.

Figure 15A:
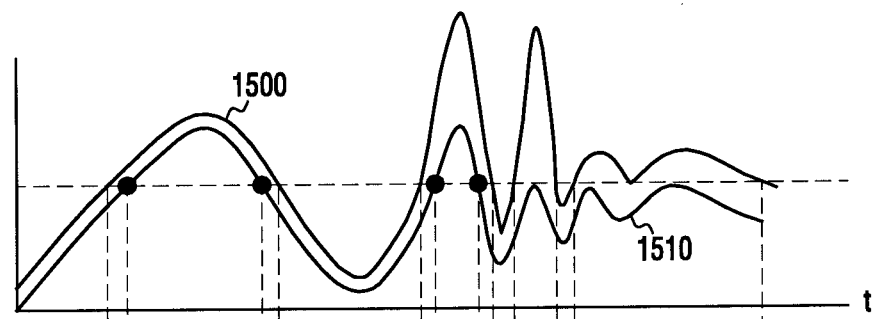
FIG. 15 illustrates an example in which the pulse width control signal is generated when the input voltage of the hysteresis comparator decreases according to various embodiments of the present disclosure.

FIG. 15 illustrates an example in which a pulse width control signal is generated by controlling an input voltage of the hysteresis comparator 408 according to various embodiments of the present disclosure.

Figure 15B:
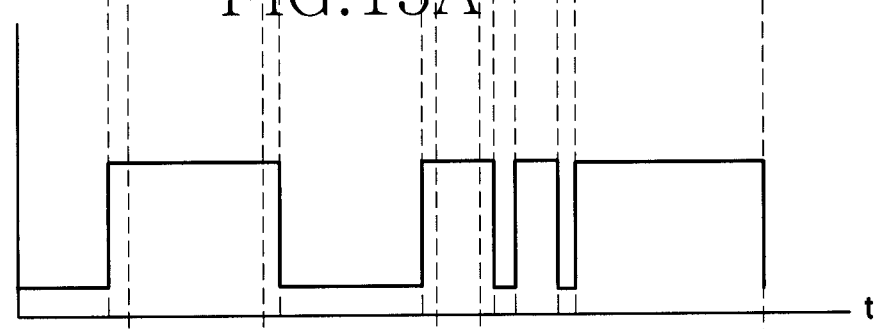
Figure 15C:
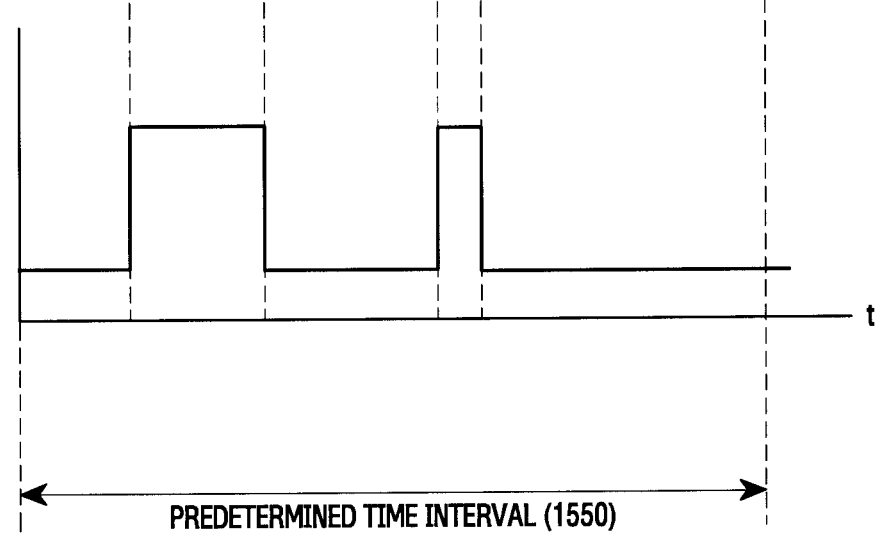

FIG. 15B illustrates an output signal according to an input voltage 1500 of a Schmitt trigger circuit, and FIG. 15C illustrates an output signal according to a changed input voltage 1510 of the Schmitt trigger circuit. The input voltage of the Schmitt trigger circuit may be changed by a voltage distribution by the variable resistance unit 415 and the current sense resistance 414.

When comparing the output signals of FIGS. 15B and 15C, it may be considered that a pulse width or the number of duty cycles is changed during a predetermined time interval 1550. For example, since four pulses, i.e., four on sections and four off sections exist during a predetermined time interval 1550 in FIG. 15B, the switching frequency may be 4 Hz when the predetermined time interval 1550 is one second. Further, since 2.5 pulses, i.e., two on sections and three off sections exist during the predetermined time interval 1550 in FIG. 15C, the switching frequency may be 2.5 Hz when the predetermined time interval 1550 is one second.

Figure 16A:
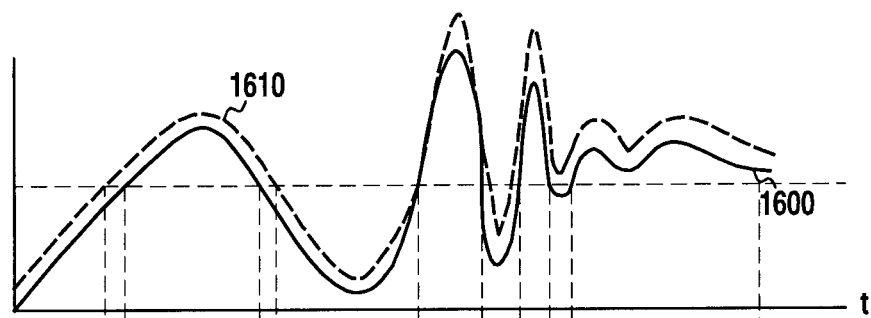
FIG. 16 illustrates an example in which a pulse width control signal is generated when an input voltage of the hysteresis comparator increases according to various embodiments of the present disclosure.

FIG. 16 illustrates an example in which a pulse width control signal is generated by controlling an input voltage of the hysteresis comparator 408 according to various embodiments of the present disclosure.

Figure 16B:
Figure 16C:
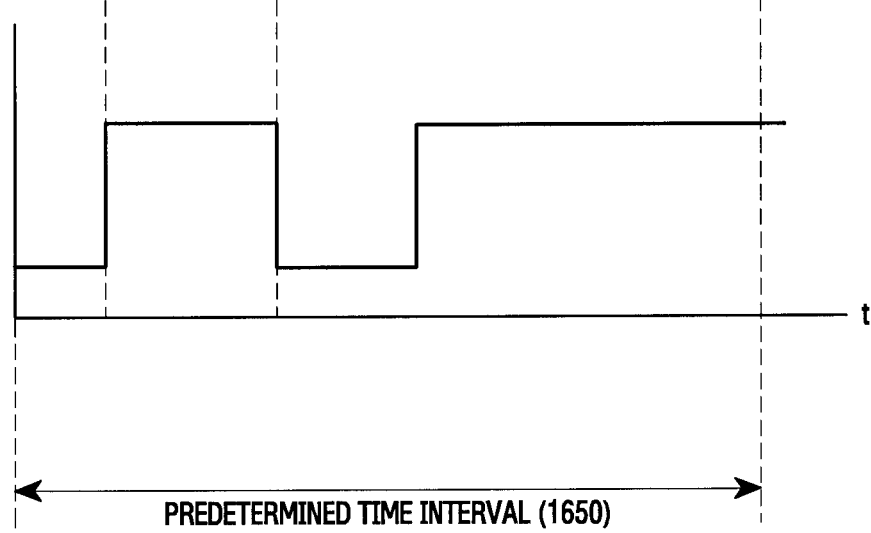

FIG. 16B illustrates an output signal according to an input voltage 1600 of a Schmitt trigger circuit, and FIG. 16C illustrates an output signal according to a changed input voltage 1510 of the Schmitt trigger circuit. The input voltage of the Schmitt trigger circuit may be changed by a voltage distribution by the variable resistance unit 415 and the current sense resistance 414.

When comparing the output signals of FIGS. 16B and 16C, it may be recognized that the number of duty cycles of a pulse width is changed. For example, since four pulses, i.e., four on sections and four off sections exist during a predetermined time interval 1650 in FIG. 16B, the switching frequency may be 4 Hz when the predetermined time interval 1650 is one second. Further, since two pulses, i.e., two on sections and two off sections exist during the predetermined time interval 1650 in FIG. 16C, the switching frequency may be 2 Hz when the predetermined time interval 1650 is one second.

Figure 17:
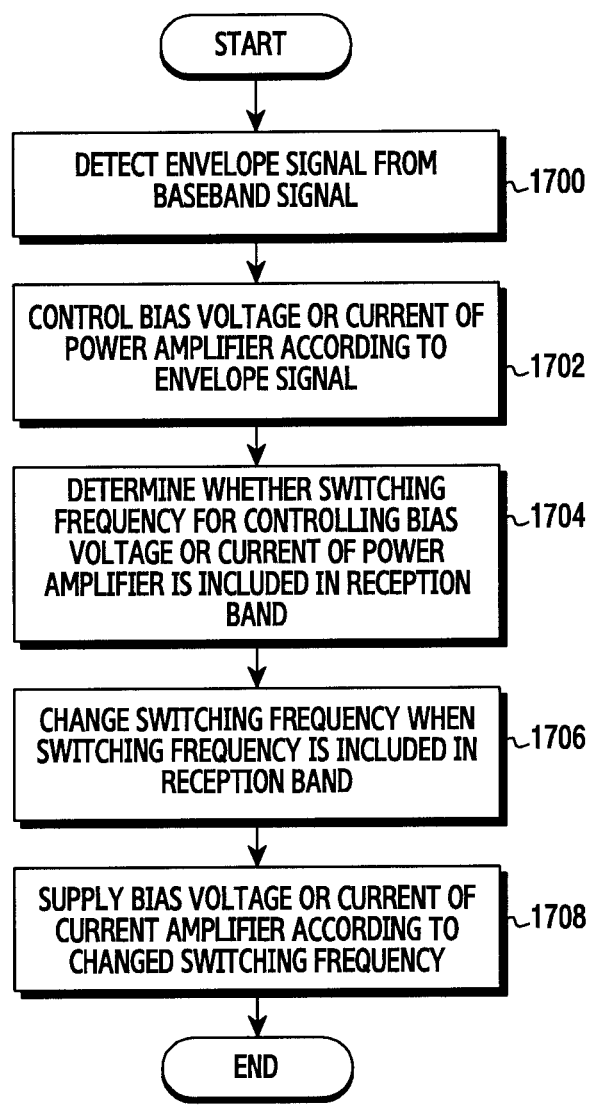
FIG. 17 is a flowchart illustrating a power amplification method according to various embodiments of the present disclosure.

FIG. 17 is a flowchart illustrating the power amplification method according to various embodiments of the present disclosure.

Referring to FIG. 17, an envelope signal is detected from a baseband signal in step 1700, and a bias of the power amplifier 404 may be controlled according to the envelope signal in the switch mode converter 410 in step 1702. For example, the switch mode converter 410 modulates a voltage supply or a battery power supply according to a pulse width control signal supplied by the hysteresis comparator 408, thereby controlling the bias of the power amplifier 404. The hysteresis comparator 408 may provide a pulse width modulated switch control signal to the switching transistor 412 of the switch mode converter 410 on the basis of the direction of the current flow detected by the current sense resistance 414. The direction of the current may be determined according to whether the linear amplifier 406 supplies (sources) a current to the RF power amplifier 404 or reduces (sinks) a supply over-current from the switch mode converter 410.

The controller 416 may determine whether the switching frequency of the switch mode converter 410 is included in a reception band in step 1704, and when the switching frequency of the switch mode converter 410 is included in a corresponding band, change a reference voltage of the hysteresis comparator 408 or control an input voltage, thereby changing the switching frequency of the switch mode converter 410 in step 1706.

The switch mode converter 410 turns on/off the switching transistor 412 according to the changed switching frequency so as to a bias voltage to the power amplifier 404 in step 1708.

Figure 18:
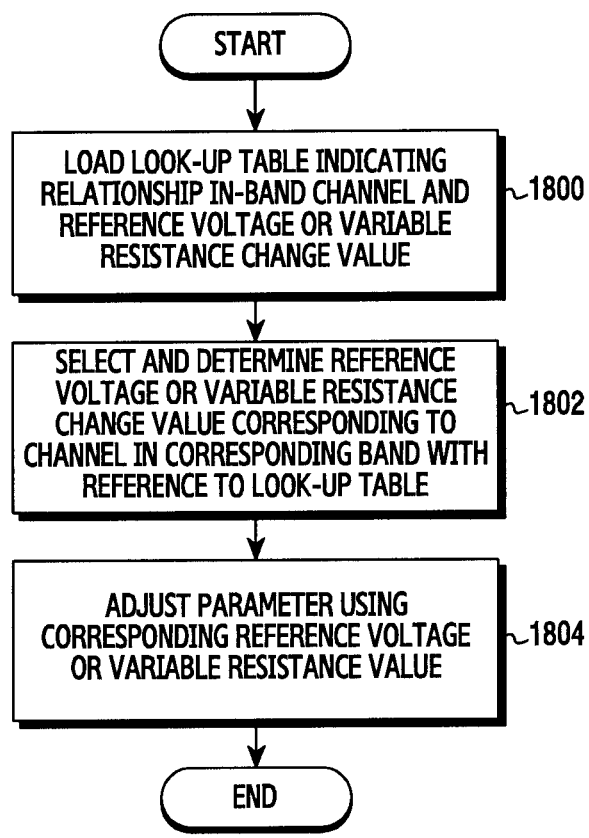
FIG. 18 is a flowchart for changing a switching frequency of a switch mode converter according to various embodiments of the present disclosure.

FIG. 18 is a flowchart for changing the switching frequency of the switch mode converter according to various embodiments of the present disclosure.

Figure 23:
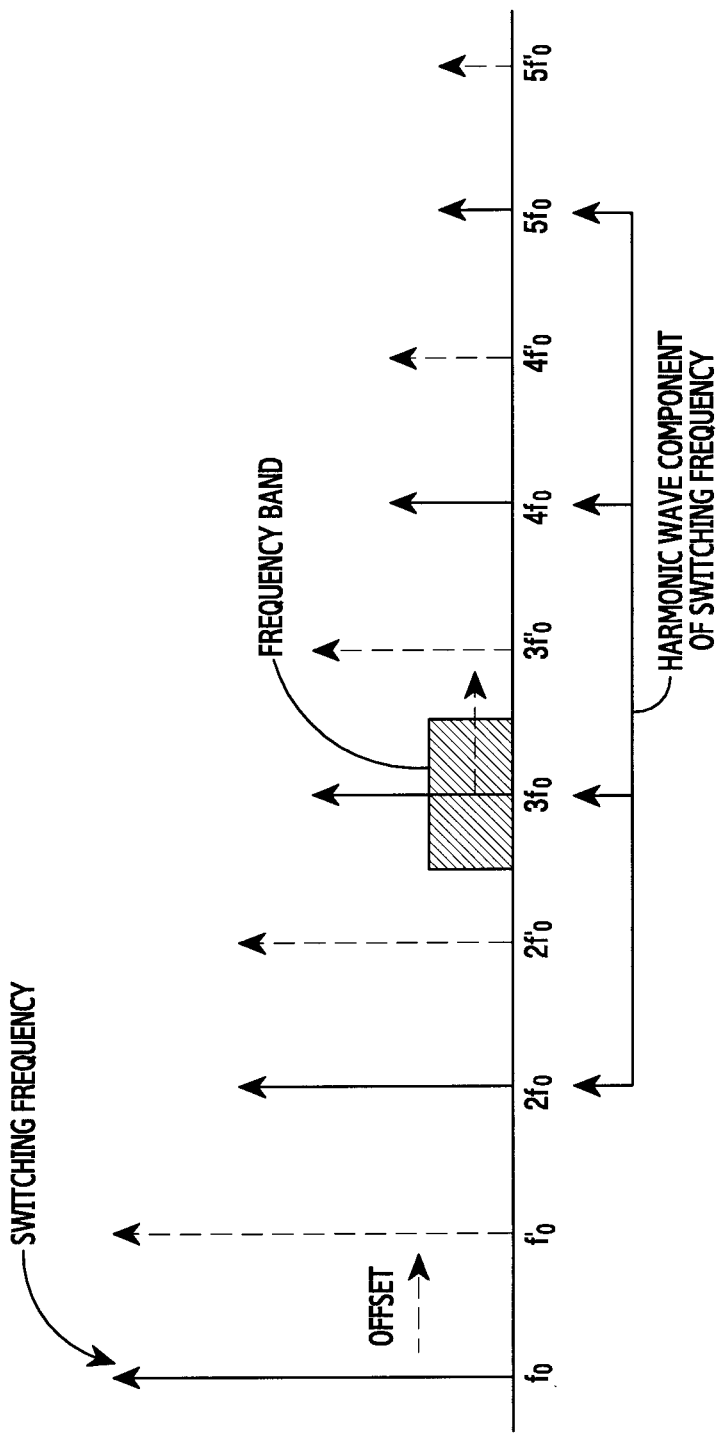
FIG. 23 illustrates an example in which harmonic components for the switching frequency are included in a reception band according to various embodiments of the present disclosure.

Referring to FIG. 18, the controller 416 may load a look-up table of FIG. 23 indicating a relationship between a channel in a band and a reference voltage or a variable resistance change value in step 1800, select a reference voltage or variable resistance change value corresponding to a channel in a corresponding band with reference to the look-up table in step 1802, and adjust a parameter using the corresponding reference voltage or variable resistance change value in step 1804. For example, an Rc1 or Rc2 value corresponding to the corresponding reference voltage change may be adjusted in FIG. 6A, an R1 or R2 value corresponding to the corresponding reference voltage change may be adjusted in FIG. 6B, or a variable resistance of the variable resistance unit 415 in FIG. 5 may be adjusted.

FIG. 19 is a flowchart for changing the switching frequency of the switch mode converter according to various embodiments of the present disclosure.

Figure 19A:
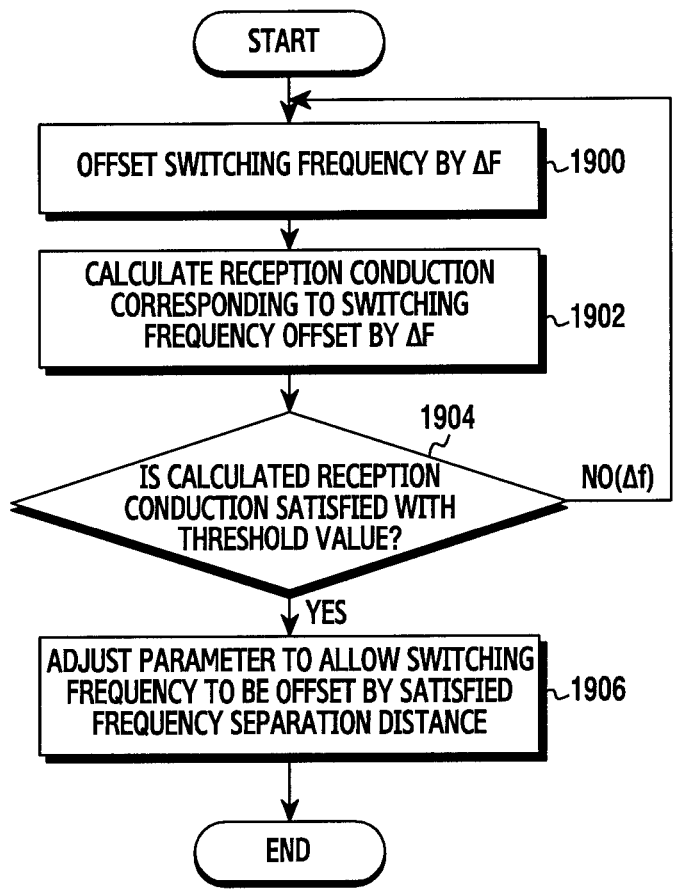
FIG. 19 is a flowchart for changing the switching frequency of the switch mode converter according to various embodiments of the present disclosure.

Referring to FIG. 19A, the controller 416 applies an offset to a switching frequency by Δf in step 1900, calculates a reception conduction corresponding to the switching frequency which is applied the offset by Δf in step 1902, proceeds to step 1906 when the calculated reception conduction is satisfied with a threshold value, adjusts a parameter to allow the switching frequency to be offset by a frequency spaced distance which the switching frequency is satisfied with, and returns to step 1900 when the calculated reception conduction is not satisfied the threshold value.

That is, the controller 1900 may apply the offset to the switching frequency by Δf until the reception conduction is satisfied.

Figure 19B:
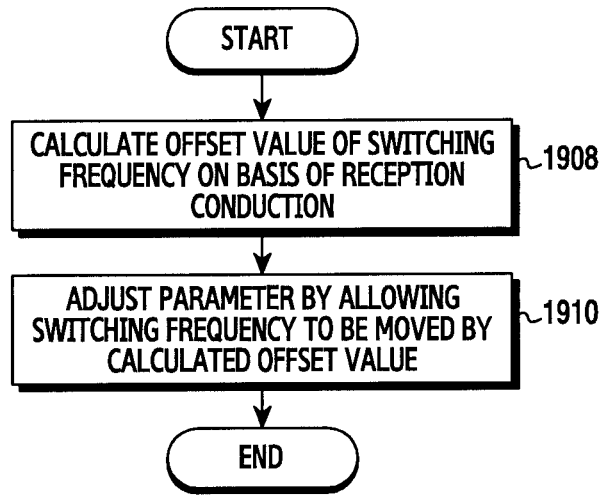

In other embodiments, referring to FIG. 19B, the controller 416 may calculate an offset value to determine how much the current switching frequency will be spaced from the corresponding band frequency band on the basis of the current reception conduction in step 1908, and adjust the parameter to move the switching frequency by the calculated offset value in step 1910. For example, Rc1 or Rc2 value corresponding to a corresponding reference voltage change may be adjusted in FIG. 6A, R1 or R2 value corresponding to a corresponding reference voltage change may be adjusted in FIG. 6B, or a variable resistance of the variable resistance unit 415 of FIG. 5 may be adjusted.

In various embodiments of the present disclosure, in a case of Voice Over LTE (VoLTE), since a bandwidth of an input envelope is small, most energy can be supplied by DC-DC switching so that the power amplifier can be operated by only a DC-DC converter. For example, in FIG. 4, a bias voltage may be supplied to the RF amplifier 404 by only the switch mode converter 410. When the bias voltage has been supplied to the RF amplifier 404 by only the switch mode converter 410, since a change amount of the switching frequency of the switch mode converter 410 is small according to a time, harmonic components depending on a fixed switching frequency may increase. The switching frequency may be offset with respect to a case in which the harmonic frequency component brings actual reception conduction degradation by determining whether the harmonic frequency component invades a reception band of the communication band.

Figure 20:
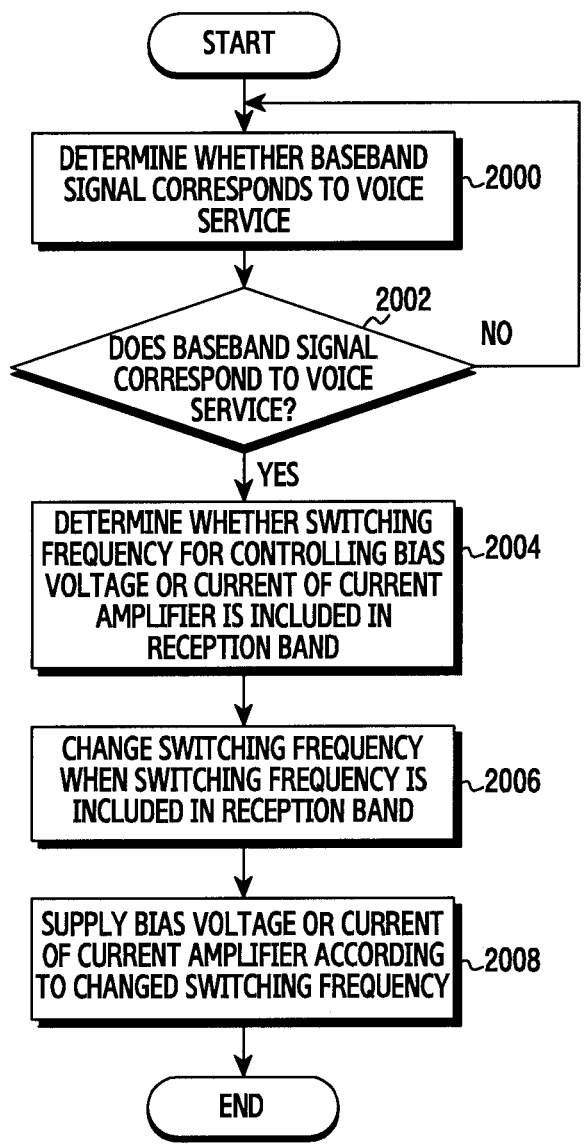
FIG. 20 is a flowchart illustrating a power amplification method according to various embodiments of the present disclosure.
Figure 21:
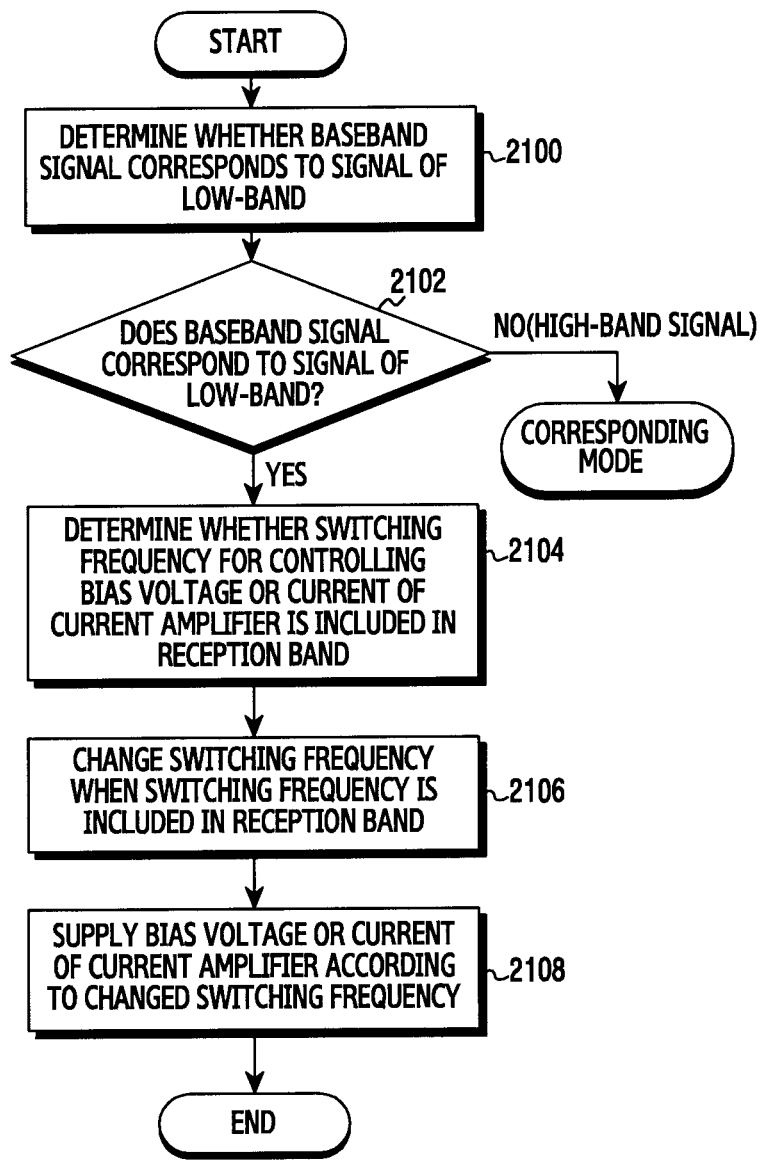
FIG. 21 is a flowchart illustrating the power amplification method according to various embodiments of the present disclosure.

FIGS. 20 and 21 illustrate a power amplification method performing the switching frequency change operation in a voice signal or a low-band signal.

FIG. 20 is a flowchart illustrating the power amplification method according to various embodiments of the present disclosure.

Referring to FIG. 20, the controller 416 may determine whether a baseband signal corresponds to a voice signal such as a VoLTE in step 2000. For example, the controller 416 may receive control information notifying that the baseband signal corresponds to the voice signal such as the VoLTE, or recognize whether the baseband signal corresponds to the voice signal such as the VoLTE by analyzing the baseband signal.

The controller 416 may determine, when the baseband signal is determined as the voice signal in step 2002, whether the switching frequency of the switch mode converter 410 is included in a reception band in step 2004, and when the switching frequency of the switch mode converter 410 is included in a corresponding band, change a reference voltage of the hysteresis comparator 408 or control an input voltage, thereby changing the switching frequency of the switch mode converter 410 in step 2006.

In step 2008, in the switch mode converter 410, the switching transistor 412 is turned on/off according to the changed switching frequency and a voltage supply or a battery power supply is modulated, thereby providing a bias voltage to the power amplifier 404.

FIG. 21 is a flowchart illustrating the power amplification method according to various embodiments of the present disclosure.

Referring to FIG. 21, the controller 416 may determine a band of a baseband signal through a spectrum analysis in step 2100. For example, the controller 416 may determine whether a band of the baseband signal corresponds to a low-band lower than a threshold value or a high-band larger than the threshold value.

When the baseband signal is determined as the low-band in step 2102, the controller 416 may determine whether the switching frequency of the switch mode converter 410 is included in a reception band in step 2104.

For example, the switching frequency band of the switch mode converter 410 may be calculated on the basis of the input envelope signal characteristics and signal characteristics of the output terminal (Vout) of the switch mode converter 410, and it is possible to determine whether the switching frequency of the switch mode converter 410 is included in the reception band by comparing the calculated switching frequency band and a reception band used in current communication.

When the switching frequency of the switch mode converter 410 is included in the corresponding reception band in step 2106, the switching frequency of the switch mode converter 410 may be changed by changing a reference voltage of the hysteresis comparator 408 or controlling an input voltage through a configuration change of the variable resistance unit 415.

Meanwhile, the switching frequency of the switch mode converter 410 is not included in a corresponding reception band, a bias voltage may be provided to the power amplifier 404 without the switching frequency change in a corresponding mode.

In step 2108, in the switch mode converter 410, the switching transistor 412 is turned on/off according to the changed switching frequency and a voltage supply or a battery power supply is modulated, thereby providing the bias voltage to the power amplifier 404.

According to various embodiments, a power amplification method, of an electronic device may include: determining whether a switching frequency of a switch mode converter is included in a reception band; and applying an offset to the switching frequency to allow the switching frequency to escape from the reception band when the switching frequency of the switch mode converter is included in a reception specific band. According to an embodiment, the switching frequency of the switch mode converter is changed on the basis of an input signal or a reference voltage of a comparator supplying a switching signal to the switch mode converter. According to an embodiment, the input signal of the comparator is distributed by a variable resistance of an input terminal. According to an embodiment, the comparator is configured by a Schmidt trigger circuit and the reference voltage of the comparator includes one of a first reference voltage changing from high to low and a second reference voltage changing from low to high. According to an embodiment, the reference voltage of the comparator may be controlled as a value of an element controlling the first reference voltage and the second reference voltage in the Schmidt trigger circuit is changed. According to an embodiment, the switching signal is a pulse signal having a frequency spectrum similar to an envelope signal, and the switching frequency is changed by changing a number of times of turning on/off during a predetermined time. According to an embodiment, the method may further include: determining whether a bias voltage corresponding to the envelope signal is provided to the power amplifier by the switch mode converter before determining whether the switching frequency of the switch mode converter is included in the reception band. According to an embodiment, the determining of whether the bias voltage corresponding to the envelope signal in the switch mode converter is provided to the power amplifier may include: determining whether a baseband signal corresponds to a voice signal; and determining whether a band of the baseband signal is smaller than a threshold value.

FIG. 22 illustrates a lookup table according to various embodiments of the present disclosure.

Referring to FIG. 22, in a look-up table, an in-band channel and a reference voltage or variable resistance change value are mapped. Therefore, when the switching frequency is included in a channel of the corresponding band in the case of reception or transmission using a channel of the corresponding band by a transmitter, a reference voltage or a variable resistance change value mapped in the channel of the corresponding band may be provided to the controller 416.

FIG. 23 illustrates an example in which harmonic components for the switching frequency are included in a reception band according to various embodiments of the present disclosure.

Referring to FIG. 23, a periodically repeated waveform which is not a sine wave decomposes into a sine wave having a basic frequency and a wave having integer multiple frequencies, and indicates components other than a basis frequency configuring a harmonic repeated waveform.

That is, the switching frequency may be generated as an n-th harmonic frequency other than the basis frequency and a part of multiple high-frequency components of the switching frequency may be included in the reception band.

In various embodiments of the present disclosure, the switching frequency is offset to allow the multiple high-frequency component of the switching frequency to be not overlapped with the reception band. Therefore, it is made not to affect the reception or transmission performance.

FIG. 24 illustrates a configuration for distributing an input voltage of the hysteresis comparator 408 according to various embodiments of the present disclosure.

Referring to FIG. 24, the variable resistance unit 415 and the current sense resistance 414 may be connected (coupled) in parallel for a voltage distribution, and a voltage across the current sense resistance 414 may be transferred to the variable resistance unit 415. In various embodiments of the present disclosure, the variable resistance unit 415 may distribute a voltage of the current sense resistance 414 according to a location of a tab. For example, when a tab is performed in a ½ position of the variable resistance, only 50% of voltage across the current sense resistance 414 is provided to an input of the hysteresis comparator 408. Further, when a tab is performed in a ⅓ position of the variable resistance, only 33% of the voltage across the current sense resistance 414 may be provided to the input of the hysteresis comparator 408.

Various embodiments of the present disclosure are not limited to an example in which the voltage across the current sense resistance 414 is distributed according to a position of the tab of the variable resistance, and may be implemented as a digital variable resistance.

According to various embodiments, a power amplification apparatus may include: a power amplifier; a switch mode converter that controls a bias voltage of the power amplifier; a comparator that provides a switching signal to the switch mode converter according to an envelope signal; and a controller that determines whether a multiplied frequency of a switching frequency of the switch mode converter is included in a reception band, and applies an offset to the switching frequency to escape from the reception band when the switching frequency of the switch mode converter is included in the reception band. According to an embodiment, the controller changes the switching frequency of the switch mode converter by changing an input signal or a reference voltage of the comparator. According to an embodiment, the power amplification apparatus may further include: a variable resistance unit that is connected to an input of the comparator and distributes an input voltage. According to an embodiment, the comparator is configured by a Schmidt trigger circuit and the reference voltage of the comparator includes one of a first reference voltage changing from high to low and a second reference voltage changing from low to high. According to an embodiment, the reference voltage of the comparator may be controlled as a value of an element controlling the first reference voltage and the second reference voltage in the Schmidt trigger circuit is changed. According to an embodiment, the switching signal is a pulse signal having a frequency spectrum similar to an envelope signal, and a control of the switching frequency is performed by changing a number of times of turning on/off during a predetermined time. According to an embodiment, the controller determines whether a multiplied frequency of a switching frequency of the switch mode converter is included in the reception band when a bias voltage corresponding to the envelope signal is provided to the power amplifier by the switch mode converter, and applies the offset to the switching frequency to escape from the reception band when the multiplied frequency of the switching frequency of the switch mode converter is included in the reception band. According to an embodiment, the controller determines whether a baseband signal corresponds to a voice signal or whether a band of the baseband signal is smaller than a threshold value so as to determine whether the bias voltage corresponding to the envelope signal may be provided to the power amplifier by only the switch mode converter. According to an embodiment, the power amplification apparatus may further include a linear amplifier that compensates for an error when a voltage difference between the envelope signal and an output signal of the switch mode converter is applied as the error.

According to various embodiments, an electronic device may include: a power amplifier; a switch mode converter that controls a bias voltage of the power amplifier; a comparator that provides a switching signal to the switch mode converter according to an envelope signal; and a controller that determines whether a multiplied frequency of a switching frequency of the switch mode converter is included in a reception band, and applies an offset to the switching frequency to escape from the reception band when the switching frequency of the switch mode converter is included in the reception band. According to an embodiment, the controller changes the switching frequency of the switch mode converter by changing an input signal or a reference voltage of the comparator. According to an embodiment, the power amplification apparatus may further include: a variable resistance unit that is connected to an input of the comparator and distributes an input voltage. According to an embodiment, the comparator is configured by a Schmidt trigger circuit and the reference voltage of the comparator includes one of a first reference voltage changing from high to low and a second reference voltage changing from low to high. According to an embodiment, the reference voltage of the comparator may be controlled as a value of an element controlling the first reference voltage and the second reference voltage in the Schmidt trigger circuit is changed. According to an embodiment, the switching signal is a pulse signal having a frequency spectrum similar to an envelope signal, and a control of the switching frequency is performed by changing a number of times of turning on/off during a predetermined time. According to an embodiment, the controller determines whether a multiplied frequency of a switching frequency of the switch mode converter is included in the reception band when a bias voltage corresponding to the envelope signal is provided to the power amplifier by the switch mode converter, and applies the offset to the switching frequency to escape from the reception band when the multiplied frequency of the switching frequency of the switch mode converter is included in the reception band. According to an embodiment, the controller determines whether a baseband signal corresponds to a voice signal or whether a band of the baseband signal is smaller than a threshold value so as to determine whether the bias voltage corresponding to the envelope signal may be provided to the power amplifier by only the switch mode converter. According to an embodiment, the power amplification apparatus may further include a linear amplifier that compensates for an error when a voltage difference between the envelope signal and an output signal of the switch mode converter is applied as the error.

Meanwhile, although the concrete embodiments of the present disclosure have been described in the detailed description of the present disclosure, various modifications can be made without departing from the scope of the present disclosure. Therefore, the scope of the present disclosure should not be limited to the aforementioned embodiments, but should be defined by the equivalents to the appended claims as well as the claims.

The invention claimed is:

1. A method for operating an electronic device comprising:
   providing, by a comparator of an envelope tracking modulator of the electronic device, to a switch mode converter of the envelope tracking modulator, a switch control signal generated based on an envelope signal associated with a signal inputted to a power amplifier of the electronic device;
   determining, by a controller of the envelope tracking modulator of the electronic device, that a frequency of the switch control signal is included in a reception band on which a signal is received from an external electronic device;
   changing, by the controller, the frequency of the switch control signal such that the frequency of the switch control signal is not included in the reception band; and
   providing, by the switch mode converter, bias voltage or bias current generated based on the changed frequency to the power amplifier.

2. The method of claim 1, wherein the frequency of the switch control signal is changed based on a signal inputted to the comparator.

3. The method of claim 2, wherein the signal inputted to the comparator is changed by a variable resistance of an input terminal of the comparator.

4. The method of claim 1, wherein the frequency of the switch control signal is changed based on a reference voltage of the comparator,
   wherein the reference voltage is a reference for changing an output voltage of the comparator as an input voltage of the comparator crosses the reference voltage, and
   wherein the switch control signal is associated with the output voltage of the comparator.

5. The method of claim 4, wherein the comparator is configured by a Schmidt trigger circuit,
   wherein the reference voltage of the comparator includes a first reference voltage and a second reference voltage,
   wherein the first reference voltage is usable for changing the output voltage from a high voltage to a low voltage, and
   wherein the second reference voltage is usable changing the output voltage from the low voltage to the high voltage.

6. The method of claim 1, wherein a frequency spectrum of the switch control signal corresponds to a frequency spectrum of the envelope signal, and
   wherein the switch control signal controls an operation of the switch mode converter by changing a number of on/off times of a switch in the switch mode converter.

7. The method of claim 1, wherein the determining that the frequency of the switch mode converter is included in the reception band further comprises:
   determining a baseband signal of the reception band corresponds to a voice signal.

8. An electronic device comprising:
   an envelope tracking modulator comprising a comparator, a controller, and a switch mode converter; and
   a power amplifier;
   wherein the comparator is configured to provide, to the switch mode converter, a switch control signal generated based on an envelope signal associated with a signal inputted to the power amplifier,
   wherein the switch control signal is used for controlling an operation of the switch mode converter,
   wherein the controller is configured to:
      determine that a frequency of the switch control signal is included in a reception band on which a signal is received from an external electronic device, and
      change the frequency of the switch control signal such that the frequency of the switch control signal is not included in the reception band, and
   wherein the switch mode converter is configured to provide bias voltage or bias current generated based on the changed frequency to the power amplifier.

9. The electronic device of claim 8, wherein the controller is configured to change the frequency of the switch control signal by changing a signal inputted to the comparator.

10. The electronic device of claim 9, wherein the comparator is further comprises a variable resistance, connected to an input terminal of the comparator, configured to change the signal inputted to the comparator.

11. The electronic device of claim 8,
    wherein the controller is configured to change the frequency of the switch control signal based on a reference voltage of the comparator,
    wherein the reference voltage is a reference for changing an output voltage of the comparator as an input voltage of the comparator crosses the reference voltage, and
    wherein the switch control signal is associated with the output voltage of the comparator.

12. The electronic device of claim 11,
    wherein the comparator is configured by a Schmidt trigger circuit,
    wherein the reference voltage of the comparator includes a first reference voltage and a second reference voltage,
    wherein the first reference voltage is usable for changing the output voltage from a high voltage to a low voltage, and
    wherein the second reference voltage is usable for changing the output voltage from the low voltage to the high voltage.

13. The electronic device of claim 8, wherein a frequency spectrum of the switch control signal corresponds to a frequency spectrum of the envelope signal, and
wherein the switch control signal controls an operation of the switch mode converter by changing a number of on/off times of a switch in the switch mode converter.

14. The electronic device of claim 8, wherein the controller is further configured to determine that a baseband signal of the reception band corresponds to a voice signal.

15. The electronic device of claim 8, wherein the controller is configured to:
determine that multiples of the frequency of the switch control signal are included in the reception band; and
change the frequency of the switch control signal such that the multiples of the frequency of the switch control signal are not included in the reception band, and
wherein the switch mode converter is configured to provide the bias voltage or the bias current generated based on the changed frequency to the power amplifier.

\* \* \* \* \*